(12) United States Patent
Mori

(10) Patent No.: US 9,646,940 B2
(45) Date of Patent: May 9, 2017

(54) GAS BARRIER FILM AND ELECTRONIC DEVICE

(75) Inventor: Takahiro Mori, Tokyo (JP)

(73) Assignee: KONICA MINOLTA, INC., Tokyo (JP)

( * ) Notice: Subject to any disclaimer, the term of this patent is extended or adjusted under 35 U.S.C. 154(b) by 79 days.

(21) Appl. No.: 13/976,300

(22) PCT Filed: Dec. 1, 2011

(86) PCT No.: PCT/JP2011/077837
§ 371 (c)(1),
(2), (4) Date: Jun. 26, 2013

(87) PCT Pub. No.: WO2012/090644
PCT Pub. Date: Jul. 5, 2012

(65) Prior Publication Data
US 2013/0280521 A1 Oct. 24, 2013

(30) Foreign Application Priority Data
Dec. 27, 2010 (JP) ................................. 2010-289190

(51) Int. Cl.
H01L 23/00 (2006.01)
C23C 14/06 (2006.01)
(Continued)

(52) U.S. Cl.
CPC ............ H01L 23/564 (2013.01); C08J 7/042 (2013.01); C23C 14/0676 (2013.01);
(Continued)

(58) Field of Classification Search
None
See application file for complete search history.

(56) References Cited

U.S. PATENT DOCUMENTS 5,614,271 A 3/1997 Shibuya et al.
2007/0026243 A1 2/2007 Iwanaga et al.
(Continued)

FOREIGN PATENT DOCUMENTS

CN 1899815 A 1/2007
CN 101039801 A 9/2007
(Continued)

OTHER PUBLICATIONS

English Translation of AEBA, JP 2007-237702, Sep. 2007, pp. 1-20.*
(Continued)

Primary Examiner — Ronak Patel
(74) Attorney, Agent, or Firm — Lucas & Mercanti, LLP

(57) ABSTRACT

The gas barrier film including, on a base, a first gas barrier layer which is formed by a physical vapor deposition method or a chemical vapor deposition method and contains Si and N; and a second gas barrier layer which is formed by coating a solution containing a polysilazane compound, wherein the second gas barrier layer is subjected to conversion treatment by being irradiated with a vacuum ultraviolet ray; and, when the composition of each layer is represented by $SiO_xN_y$, the distribution of the composition $SiO_xN_y$ of the second gas barrier layer in a thickness direction satisfies a condition specified in the following (A): (A) the second gas barrier layer includes 50 nm or more of a region of $0.25 \leq x \leq 1.1$ and $0.4 \leq y \leq 0.75$ in the thickness direction.

6 Claims, 3 Drawing Sheets

(51) Int. Cl.
  *C23C 14/56* (2006.01)
  *C23C 26/00* (2006.01)
  *C23C 16/02* (2006.01)
  *C23C 16/30* (2006.01)
  *C23C 16/34* (2006.01)
  *C23C 28/04* (2006.01)
  *C08J 7/04* (2006.01)

(52) U.S. Cl.
  CPC ........ *C23C 14/562* (2013.01); *C23C 16/0272* (2013.01); *C23C 16/308* (2013.01); *C23C 16/345* (2013.01); *C23C 26/00* (2013.01); *C23C 28/04* (2013.01); *C08J 2383/02* (2013.01); *H01L 2924/0002* (2013.01); *Y10T 428/26* (2015.01)

(56) References Cited

U.S. PATENT DOCUMENTS

| | | | |
|---|---|---|---|
| 2007/0269664 A1 | 11/2007 | Fujii et al. | |
| 2009/0110896 A1 | 4/2009 | Kuramachi et al. | |
| 2009/0167164 A1* | 7/2009 | Fukuda et al. | 313/504 |
| 2010/0166977 A1 | 7/2010 | Brand et al. | |
| 2011/0086220 A1* | 4/2011 | Yoshida et al. | 428/317.5 |
| 2012/0107607 A1* | 5/2012 | Takaki | C08J 7/047 428/336 |

FOREIGN PATENT DOCUMENTS

| | | |
|---|---|---|
| CN | 101233200 A | 7/2008 |
| EP | 2-080-613 | 7/2009 |
| JP | 08-281861 A | 10/1996 |
| JP | 2005-56587 A | 3/2005 |
| JP | 2008-235165 A | 10/2008 |
| JP | 2009-503157 A | 1/2009 |
| JP | 2009-029070 A | 2/2009 |
| JP | 2009-226707 A | 10/2009 |
| JP | 2009-255040 A | 11/2009 |
| JP | 2011-156752 A | 8/2011 |
| JP | 2011-183773 A | 9/2011 |
| JP | 2012-016854 A | 1/2012 |
| KR | 2000-0043921 | 7/2000 |
| WO | WO 2009/139391 * | 11/2009 |
| WO | 2010/004932 | 1/2010 |
| WO | WO 2012/014653 A1 | 2/2012 |

OTHER PUBLICATIONS

English Translation of Matsui, JP 11-151774, Jun. 1999, pp. 1-22.*
Chinese Office Action, Application No. 201180062272.9. Date of Notification: Feb. 7, 2014 with English translation thereof (16 total pages).
IPRP and English translation thereof, date of issuance of report Jul. 2, 2013.
Supplemental European Search Report, EP 11 85 2550, dated May 28, 2014 (5 pages).
Leibniz Institute of Surface Modification Biannual Report; 2008-2009; pp. 18-21.
International Search Report of PCT/JP2011/077837 dated Feb. 28, 2012.

* cited by examiner

GAS BARRIER FILM AND ELECTRONIC DEVICE

CROSS REFERENCE TO RELATED APPLICATION

This Application is a 371 of PCT/JP2011/077837 filed on Dec. 1, 2011, which claimed the priority of Japanese Patent Application No. 2010-289190 filed on Dec. 27, 2010, both applications are incorporated herein by reference in their entirety.

BACKGROUND

1. Technical Field

The present invention relates to gas barrier films and electronic devices and, more specifically, to a gas barrier film used in an electronic device generally for an organic electroluminescence (EL) element, a solar cell element, a liquid crystal display element, or the like, and an electronic device in which the gas barrier film is used.

2. Description of Related Arts

Conventionally, gas barrier films formed by laminating a plurality of layers containing thin films of metal oxides such as aluminum oxide, magnesium oxide, and silicon oxide on plastic substrate and film surfaces have been widely used for packaging articles needing to be shielded against various gases such as moisture vapor and oxygen, e.g., food products, industrial products, pharmaceutical products, and the like.

In addition to packaging applications, development to flexible electronic devices for solar cell elements, organic electroluminescence (EL) elements, liquid crystal display elements, and the like, having flexibility has been demanded and many examinations thereof have been made. However, these flexible electronic devices require very high gas barrier properties equivalent to a glass base level. Any gas barrier film having such a high barrier property has not yet been currently obtained.

As a method for forming a gas barrier film, there has been known a gas phase method such as a chemical deposition method (plasma CVD method: Chemical Vapor Deposition) by which a film is formed on a substrate while oxidizing an organosilicon compound represented by tetraethoxysilane (TEOS) by oxygen plasma under reduced pressure or a physical deposition method (vacuum deposition method or sputtering method) by which metallic silicon is evaporated to be deposited on a substrate using a semiconductor laser in the presence of oxygen.

Inorganic film formation methods by these gas phase methods have been preferably applied to formation of inorganic films including silicon oxide or silicon oxynitride since a thin film with accurate composition can be formed on a substrate. However, it is very difficult to form an inorganic film without any defect and a gas barrier film obtained by an inorganic film formation method does not industrially sufficiently have a gas barrier property required by a flexible electronic device. Although such an examination that a film thickness is simply increased to laminate a plurality of inorganic films by a gas phase method has been made, any film having a desired gas barrier property has not been obtained since a defect continuously grows and the number of cracks is contrarily increased.

In contrast, there has been also examined a gas barrier film obtained by forming a laminate in which inorganic films and organic films are alternately laminated more than once by a gas phase method. According to the gas barrier film, the film thickness of the inorganic films can be increased without continuously growing any defect and a gas barrier property can be further improved utilizing a so-called maze effect that a gas transmission path length is increased due to the different in-plane direction positions of the defects of the inorganic films. However, it cannot be said that a sufficient gas barrier property can be currently realized even in the gas barrier film in which such organic films are combined. It is considered that practical use thereof is also difficult in view of a cost in consideration of a complicated production step, significantly low productivity for performance, and the like.

As one of methods for solving the above-described problems, there has been examined a method by which a solution of an inorganic precursor compound is coated on an inorganic film formed by a gas phase method to make a multilayered constitution to improve a gas barrier property.

For example, Patent Literature 1 discloses a gas barrier film in which a solution containing polysilazane as an inorganic precursor compound is laminated and coated more than once on a gas barrier layer formed on a resin base by a vacuum plasma CVD method and then subjected to heat-treating to form a silicon oxide layer and thereby a gas barrier property is improved. It is described that the mechanism of improving the gas barrier property is not clear but examples of the factors of the improvement in gas barrier property include the good adhesiveness of a lamination interface and the functioning of a polysilazane heat treatment layer as a protective layer for a gas barrier layer. However, since this gas barrier film requires heating at 160° C. for 1 hour in the heat treatment of the polysilazane coating layer, it is significantly poor in productivity. Further, since the improvement level of a moisture vapor transmission rate by applying the polysilazane heat treatment layer is around 1/10 and the arrival level of the moisture vapor transmission rate is around $5\times10^{-2}$ g/m²·day, the gas barrier property has been far inferior to that demanded by a flexible electronic device.

Patent Literature 2 disclosed an organic EL apparatus in which a gas barrier layer formed on an organic EL element by a plasma CVD method is coated with polysilazane, followed by carrying out baking treatment to form a protective layer. It is described that water can be prevented from infiltrating by covering the defect of the gas barrier layer that can be formed and generated by the plasma CVD method, with the protective layer formed by baking treatment of polysilazane. It is further described that water can be prevented from infiltrating by making polysilazane in a semidry state to make an unreacted part remain and by reacting the part with infiltrating water. However, the protective layer mainly containing silicon oxide, formed by the baking treatment of polysilazane, does not substantially have such a gas barrier property as demanded by a flexible electronic device. Further, although the unreacted polysilazane film gradually reacts with water in the atmosphere to becomes silicon oxide, it cannot be said that there is the long-term function of preventing water from infiltrating since the reaction is completed for several days to several months, and unreacted water cannot be prevented from infiltrating since the reaction rate of the reaction is not high.

In contrast, Patent Literature 3 discloses an electronic component in which an inorganic film formed on a resin substrate by a gas phase method and a polysilazane film are sequentially formed. Like Patent Literature 2, it is described that water is prevented from infiltrating into an electronic component element portion by reacting the unreacted part of the polysilazane film with water and water infiltration can be suppressed for a long term by reducing the amount of water infiltrating into the polysilazane layer by the inorganic film formed by the gas phase method. However, as mentioned above, polysilazane heat-cured and moist-heat-cured films in themselves do not substantially have any gas barrier property, a reaction of unreacted polysilazane with water is not rapid, a water transmission prevention effect is therefore insufficient, and, thus, any gas barrier property demanded by a flexible electronic device cannot be obtained.

Patent Literature 4 discloses, as another attempt, a transparent laminate in which a silicon nitride film is formed on a transparent substrate under specific CVD conditions. The transparent laminate described in Patent Literature 4 prevents water from infiltrating by reacting a silicon nitride compound with water. It is described that the silicon nitride film becomes such a chemically unstable film as being able to be oxidized in an atmosphere in which oxygen and water are present by forming the silicon nitride film under the specific CVD conditions and oxygen and moisture vapor can be prevented from passing through the transparent laminate by the absorption of oxygen and moisture vapor by the film. However, since the way in which the CVD-formed silicon nitride film to be originally function as a gas barrier layer become the chemically unstable film is not explained at all and any film composition is not mentioned, there is a concern whether or not the chemically unstable silicon nitride film can be stably formed. Further, as for the transparent laminate described in Patent Literature 4, since it is necessary to maintain the silicon nitride film in a chemically unstable state by forming chemically stable gas barrier films on both sides of the silicon nitride film, at least three inorganic layers formed by a gas phase method such as CVD are substantially necessary and the transparent laminate described in Patent Literature 4 has a constitution with poor productivity.

On the other hand, there has been made the examination of expressing a high gas barrier property by converting polysilazane in itself.

As mentioned above, polysilazane with (Si—N) as a basic structure changes to silicon oxide in the state of comparatively small volume shrinkage since nitrogen is directly substituted with oxygen by oxygen and moisture vapor in the air by heat treatment or moist heat treatment. As a result, a comparatively dense film can be obtained with a few defects in the film due to the volume shrinkage.

However, the formation of the dense silicon oxide film by the thermal conversion of polysilazane requires a high temperature of 450° C. or more and it was not able to be adapted to a flexible substrate such as a plastic.

As means for solving such a problem, there has been proposed a method for forming a silicon oxide film by irradiating a coating film formed by coating a polysilazane solution, with vacuum-ultraviolet light.

Vacuum-ultraviolet light with a wavelength of 100 to 200 nm (hereinafter also referred to as "VUV" or "VUV light") has a larger light energy than bonding force between respective atoms of polysilazane. The silicon oxide film can be formed at a comparatively low temperature by making an oxidation reaction due to active oxygen or ozone proceed while directly cutting an atomic bond by the action only of a photon by using the light energy (light quantum process).

Patent Literature 5 and Non Patent Literature 1 disclose a method for producing a gas barrier film by irradiating a polysilazane compound coating film with VUV light by using an excimer lamp. However, production conditions are not examined in detail and the gas barrier property of the obtained gas barrier film is far inferior to the gas barrier property demanded by a flexible electronic device. Further-more, the relationship between the film composition of the polysilazane converted film obtained by irradiating the polysilazane compound with the VUV light and the gas barrier property has been currently hardly examined.

As described above, there has been demanded a gas barrier film enabling compatibility between a very high barrier property required by a flexible electronic device or the like and productivity.

CITATION LIST

Patent Literature

Patent Literature 1: Japanese Patent Laid-Open hereafter referred to as JP-A) No. H08-281861
Patent Literature 2: JP-A No. 2005-056587
Patent Literature 3: JP-A No. 2009-226707
Patent Literature 4: JP-A No. 2009-029070
Patent Literature 5: National Publication of International Patent Application No. 2009-503157

Non Patent Literature

Non Patent Literature 1: Leibniz Institute of Surface Modification Biannual Report 2008/2009: P18-P21

SUMMARY

Technical Problem

The present invention is accomplished with respect to the above-described problems and an object thereof is to provide a gas barrier film which has high productivity by combining film formation by a gas phase method, such as vacuum film formation, with film formation by coating, and is excellent in gas barrier performance and heat resistance; and an electronic device excellent in durability in which the gas barrier film is used.

Solution to Problem

The above-described object of the present invention is achieved by the following constitutions:

1. A gas barrier film including, on a base, a first gas barrier layer which is formed by a physical vapor deposition method or a chemical vapor deposition method and contains Si and N; and a second gas barrier layer which is adjacent thereto and is formed by coating a solution containing a polysilazane compound, in this order, wherein the second gas barrier layer is subjected to conversion treatment by being irradiated with a vacuum ultraviolet ray; and, when the compositions of the first gas barrier layer and the second gas barrier layer are represented by $SiO_xN_y$, the distribution of the composition $SiO_xN_y$ of the second gas barrier layer in a thickness direction satisfies a condition specified in the following (A).

(A) The second gas barrier layer includes 50 nm or more of a region of $0.25 \leq x \leq 1.1$ and $0.4 \leq y \leq 0.75$ in the thickness direction.

2. The gas barrier film according to 1 described above, wherein the distribution of the composition $SiO_xN_y$ of the second gas barrier layer in a thickness direction satisfies a condition specified in the following (B).

(B) The second gas barrier layer includes 50 nm or more of a region of $0.25 \leq x \leq 0.55$ and $0.55 \leq y \leq 0.75$ in the thickness direction.

3. The gas barrier film according to 1 or 2 described above, wherein the distribution of the compositions $SiO_xN_y$ of the first gas barrier layer and the second gas barrier layer in a thickness direction satisfies a condition specified in the following (C).

(C) The maximum value of a y value in the first gas barrier layer and the second gas barrier layer is included in the first gas barrier layer.

4. The gas barrier film according to any one of 1 to 3 described above, wherein the distribution of the composition $SiO_xN_y$ of the second gas barrier layer in a thickness direction satisfies a condition specified in the following (D).

(D) In the surface layer region of the second gas barrier layer, x/y is 6.0 or more.

5. An electronic device including the gas barrier film according to any one of 1 to 4 described above.

Advantageous Effects of Invention

According to the present invention, there can be provided a gas barrier film which has high productivity and is excellent in gas barrier performance and heat resistance without needing any multilayered gas barrier layer by film formation by a gas phase method in combination of coating; and an electronic device excellent in durability, in which the gas barrier film is used.

DETAILED DESCRIPTION

Figure 1:
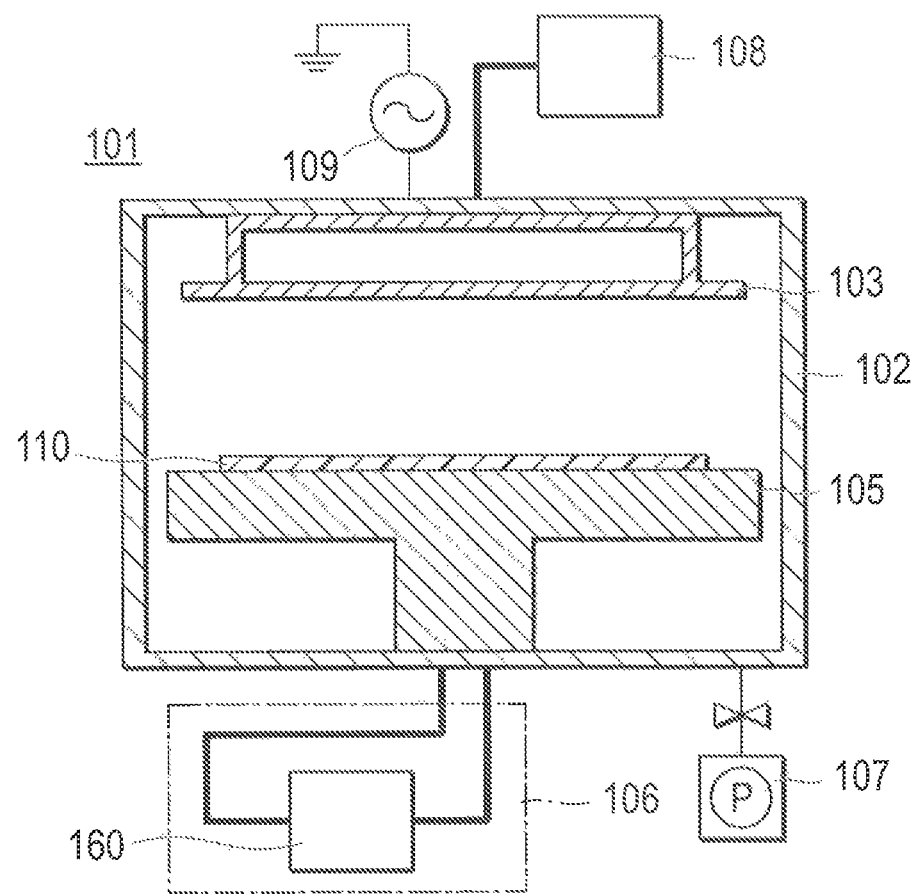
FIG. 1 is a schematic view illustrating an example of a vacuum plasma CVD apparatus used for forming a first gas barrier layer according to the present invention.

Embodiments according to the present invention will be described in detail below.

As a result of conducting extensive research with respect to the above-described problems, the present inventors found that a gas barrier film which has high productivity in combination of coating without needing any multilayered gas barrier layer by film formation a gas phase method and is excellent in gas barrier performance and heat resistance can be realized by the gas barrier film including, on a base, a first gas barrier layer which is formed by a physical vapor deposition method or a chemical vapor deposition method and contains Si and N; and a second gas barrier layer which is adjacent thereto and is formed by coating a solution containing a polysilazane compound, in this order, wherein the second gas barrier layer is subjected to conversion treatment by being irradiated with a vacuum ultraviolet ray; and, when the compositions of the first gas barrier layer and the second gas barrier layer are represented by $SiO_xN_y$, the distribution of the composition $SiO_xN_y$ of the second gas barrier layer in a thickness direction includes 50 nm or more of a region of $0.25 \leq x \leq 1.1$ and $0.4 \leq y \leq 0.75$ in the thickness direction, and the present invention was thus accomplished.

That is, in accordance with the present invention, a gas barrier film having a very high gas barrier property was able to be obtained by controlling, in the range of a specific composition ratio, the composition of a second gas barrier layer formed by a coating manner and converted by being irradiated with a vacuum ultraviolet ray, particularly in the above-described layer constitution. In addition, desired "gas barrier performance" as used herein refers to a metal calcium corrosion area of less than 5% in the case of storing for 20 hours in an evaluation of moisture vapor barrier property using metal calcium, which is one of evaluation methods adopted in Examples mentioned below.

Now, a detailed description is made of the components of the gas barrier film of the present invention.

« Gas Barrier Film »

The gas barrier film of the present invention includes, on at least one surface side of a base, a first gas barrier layer which is formed by a physical vapor deposition method or a chemical vapor deposition method; and a second gas barrier layer which is adjacent thereto and is formed by coating a solution containing at least a polysilazane compound. The laminated constitution of the first gas barrier layer and the second gas barrier is made to be a gas barrier layer unit, and a gas barrier property can also be further improved by laminating a plurality of gas barrier layer units. There is also preferred constitution in which gas barrier layer units are placed on both surfaces of the base.

[Base]

The base used in the present invention is a long support, capable of holding a gas barrier layer (also simply referred to as "barrier layer") having a gas barrier property (also simply referred to as "barrier property"). The base is specifically formed of such materials as described below without particular limitation thereto.

Examples may include each resin film of an acrylic acid ester, a methacrylic acid ester, polyethylene terephthalate (PET), polybutylene terephthalate, polyethylene naphthalate (PEN), polycarbonate (PC), polyarylate, polyvinyl chloride (PVC), polyethylene (PE), polypropylene (PP), polystyrene (PS), nylon (Ny), aromatic polyamide, polyether ether ketone, polysulfone, polyether sulfone, polyimide, polyetherimide, or the like; a heat-resistant transparent film containing silsesquioxane having an organic-inorganic hybrid structure as a basic skeleton (e.g., product name Sila-DEC, manufactured by Chisso Corporation; product name SILPLUS, manufactured by Nippon Steel Chemical Co., Ltd.; or the like); and, in addition, resin films constituted by laminating two or more layers of the above resins.

With respect to the cost or the ease of obtaining, polyethylene terephthalate (PET), polybutylene terephthalate, polyethylene naphthalate (PEN), polycarbonate (PC), and the like are preferably used; and, further, with respect to optical transparency, heat resistance, and adhesiveness between the inorganic layer and the gas barrier layer, a heat-resistant transparent film containing silsesquioxane having an organic-inorganic hybrid structure as a basic skeleton is preferably used.

On the other hand, process temperature may be more than 200° C. in an array production step, for example, when a gas barrier film is used for applications of electronic devices such as flexible displays. There is a concern that, in the case of production by roll-to-roll, since tensile force to a certain degree is always applied to a base, when the base is placed under high temperature, temperature of the base increases and is over more than a glass transition point temperature, and thereby the elastic modulus of the base is sharply decreased to extend the base due to the tensile force and a gas barrier layer is damaged. Accordingly, a heat-resistant material having a glass transition point of 150° C. or more is preferably used as the base in such an application. That is, it is preferable to use polyimide, polyetherimide, or a heat-resistant transparent film with silsesquioxane having an organic-inorganic hybrid structure as a basic skeleton. However, there is a concern that the heat-resistant resin represented thereby, because of being noncrystalline, has a high water absorption rate, compared with PET or PEN which is crystalline, to result in greater dimensional change of the base due to humidity, and a gas barrier layer is damaged. However, even when these heat-resistant materials are used for the base, the formation of gas barrier layers or gas barrier layer units (layers including a plurality of gas barrier layers) on both surfaces can result in suppression of dimensional change due to moisture absorption and desorption by a base film in itself under severe conditions of high temperature and high humidity and damage to the gas barrier layers. Accordingly, it is one of more preferred embodiments that a heat-resistant material is used for the base and the gas barrier layer units are formed on both surfaces.

The thickness of the base is preferably around 5.0 to 500 µm, further preferably 25 to 250 µm.

Further, the base is preferably transparent. A base being transparent means that the light transmittance of visible light (400 to 700 nm) is 80% or more.

This is because the base which is transparent and a gas barrier layer formed on the base which is also transparent enable a transparent gas barrier film to be made and therefore also a transparent substrate for an organic EL element or the like to be made.

Further, the base employing any resin as mentioned above may be a non-stretched film or a stretched film.

The base used in the present invention can be produced by a common method known in the art. For example, a substantially amorphous, non-oriented, and non-stretched base can be produced by melting a resin as a material in an extruder and extruding the melt through a ring die or a T-die to quench the melt.

Further, a stretched base may be produced by stretching a non-stretched base in a base flow (longitudinal axis) direction or a direction perpendicular (transverse axis) to the base flow direction by a known method such as uniaxial stretching, tenter-type sequential biaxial stretching, tenter-type simultaneous biaxial stretching, or tubular simultaneous biaxial stretching.

The stretching magnification in this case is preferably 2 to 10 times in each of the longitudinal axis direction and the transverse axis direction, although the stretching magnification may be appropriately selected in accordance with the resin as a raw material of the base.

Furthermore, it is preferable to carry out relaxation treatment after stretching in order to improve the dimensional stability of the substrate in the stretched film.

Further, for the base according to the present invention, prior to forming the gas barrier layer, its surface may also be subjected to corona treatment.

[Intermediate Layer]

In the gas barrier film of the present invention, various intermediate layers having each function can be disposed between the base and the gas barrier layer unit.

(Anchor Coat Layer)

It is preferable to form an anchor-coat layer on the surface, of the side on which the coating film is formed, of the base according to the present invention, for the purpose of improving adhesiveness with the gas barrier layer unit.

Examples of anchor coat agents used for the anchor coat layer include polyester resins, isocyanate resins, urethane resins, acrylic resins, ethylene vinyl alcohol resins, vinyl modified resins, epoxy resins, modified styrene resins, modified silicon resins, alkyl titanate, and the like, which may be used singly or in combination of two or more kinds thereof.

An additive known in the art can also be added to these anchor coat agents. In addition, the anchor coating may be performed by coating such an anchor coat agent as described above on a support by a known method, such as roll coat, gravure coat, knife coat, dip coat, or spray coat, and drying to remove a solvent, a diluent, and the like. The amount of the coated anchor coat agent as described above is preferably around 0.1 to 5.0 g/m$^2$ (in a dry state).

The anchor coat layer can also be formed by a gas phase method such as a physical vapor deposition method or a chemical vapor deposition method. For example, as described in JP-A No. 2008-142941, an inorganic film mainly composed of silicon oxide can be also formed for the purpose of improving adhesiveness. Alternatively, when such an anchor coat layer as described in JP-A No. 2004-314626 is formed and an inorganic thin film is formed thereon by a gas phase method, the anchor coat layer can also be formed for the purpose of shielding a gas generated from a base side to a certain extent to control the composition of the inorganic thin film.

(Smooth Layer)

The gas barrier film of the present invention may also include a smooth layer between the base and the gas barrier layer unit. The smooth layer used in the present invention is disposed in order to flatten the roughened surface of a transparent resin film support, on which projections and/or the like are present, or to fill and flatten recesses and projections or pinholes generated in the transparent inorganic compound layer by the projections present on the transparent resin film support. Such a smooth layer is basically formed by curing a photosensitive material or a thermosetting material.

Examples of the photosensitive material used in the smooth layer include a resin composition comprising an acrylate compound having a radical reactive unsaturated group; a resin composition comprising an acrylate compound and a mercapto compound having a thiol group; a resin composition in which a polyfunctional acrylate monomer such as epoxy acrylate, urethane acrylate, polyester acrylate, polyether acrylate, polyethylene glycol acrylate, or glycerol methacrylate is dissolved; and the like. Such resin compositions as described above may also be optionally mixed and used, and the photosensitive material is not particularly limited as long as the material is a photosensitive resin containing a reactive monomer having one or more photopolymerizable unsaturated bonds in a molecule.

Specific examples of the thermosetting material include tutoProm series (organic polysilazane) manufactured by Clariant, SP COAT heat-resistant clear coating manufactured by Ceramic Coat Co., Ltd., nanohybrid silicone manufactured by ADEKA Corporation, UNIDIC V-8000 Series, EPICLON EXA-4710 (super-high-heat-resistant epoxy resin), manufactured by DIC Corporation, various silicon resins manufactured by Shin-Etsu Chemical Co., Ltd., inorganic/organic nanocomposite material SSG coat manufactured by Nitto Boseki Co., Ltd., thermosetting urethane resins comprising acrylic polyols and isocyanate prepolymers, phenolic resins, urea melamine resins, epoxy resins, unsaturated polyester resins, silicon resins, and the like. Among them, epoxy resin-based materials having heat resistance are particularly preferred.

The method for forming a smooth layer is not particularly limited, however, the formation is preferably performed by wet coating methods such as spray coating methods, blade coating methods, and dip coating methods, and dry coating methods such as vapor deposition methods.

In the formation of the smooth layer, an additive such as an oxidation inhibitor, an ultraviolet ray absorbing agent, or a plasticizer may be optionally added to the above-mentioned photosensitive resin. A resin or an additive suitable for improving the film forming property or for preventing occurrence of pinholes may also be used in any smooth layer irrespective of the laminate position of the smooth layer.

The smoothness of the smooth layer is evaluated by surface roughness specified in JIS B 0601, and a maximum cross-sectional height Rt(p) is preferably 10 nm or more and 30 nm or less. When the value is 10 nm or more, there is no concern that a coating property is deteriorated when coating means contacts with the surface of the smooth layer in a coating manner with a wire bar, a wireless bar, or the like in the step of coating a silicon compound described below. Further, when the value is 30 nm or less, it may be easy to smooth recesses and projections after coating the silicon compound.

(Bleedout Preventing Layer)

The gas barrier film according to the present invention may also have a bleedout preventing layer on the side opposite to the smooth layer of the base.

The bleedout preventing layer is disposed on the surface opposite to the surface of the base having the smooth layer for the purpose of inhibiting the phenomenon of the contamination of the contact surface due to the migration of an unreacted oligomer and/or the like from the inside of the film having the smooth layer to the surface, when the film having the smooth layer is heated. As long as the bleedout preventing layer has this function, the bleedout preventing layer may have the same constitution as that of the smooth layer.

As an unsaturated organic compound having a polymerizable unsaturated group, which may be incorporated as a hard coat agent in the bleedout preventing layer, examples includes a polyvalent unsaturated organic compound having two or more polymerizable unsaturated groups in the molecule or a mono unsaturated organic compound having one polymerizable unsaturated group in the molecule, or the like.

As other additive agents, a matting agent may be incorporated. As a matting agent, inorganic particles having an average particle diameter of around 0.1 to 5 μm are preferred. As such inorganic particles, one kind or two or more kinds in combination of silica, alumina, talc, clay, calcium carbonate, magnesium carbonate, barium sulfate, aluminum hydroxide, titanium dioxide, zirconium oxide, and the like may be used.

The matting agent containing inorganic particles is desirably contained in 2 parts by weight or more, preferably 4 parts by weight or more, and more preferably 6 parts by weight or more, but 20 parts by weight or less, preferably 18 parts by weight or less, and more preferably 16 parts by weight or less, based on 100 parts by weight of the solid content of a hard coat agent.

In the bleedout preventing layer, a thermoplastic resin, a thermosetting resin, an ionizing radiation curable resin, a photopolymerization initiator, or the like, other than the above-described hard coat agent, as another component except the hard coat agent and the matting agent, may also be incorporated.

Such a bleedout preventing layer as described above can be formed by preparing a coating liquid by blending a hard coat agent, a matting agent, and optionally another component with an appropriately optionally used diluting solvent, coating the coating liquid on the surface of the support film by a coating method known in the art, and thereafter irradiating the liquid with ionizing radiation to cure the liquid.

A method for irradiation with ionizing radiation can be performed by irradiation with ultraviolet rays in a wavelength region of 100 to 400 nm, preferably 200 to 400 nm, emitted from an ultra-high-pressure mercury lamp, a high-pressure mercury lamp, a low-pressure mercury lamp, a carbon arc, a metal halide lamp, or the like, or by irradiation with electron beams in a wavelength region of 100 nm or less, emitted from a scanning- or curtain-type electron beam accelerator.

The thickness of a bleedout preventing layer is 1.0 to 10 μm and preferably 2 μm to 7 μm, in view of improving the heat resistance of a film, making it easy to adjust the balance in the optical property of a film, and preventing the curl in the case of disposing a bleedout preventing layer only on one surface of a gas barrier film.

[First Gas Barrier Layer]

In accordance with the present invention, the first gas barrier layer has one characteristic in that it is formed by a physical vapor deposition method or a chemical vapor deposition method and it contains at least Si and N.

The constitution of the first gas barrier layer according to the present invention is preferably $SiO_xN_y$ or SiN. In $SiO_xN_y$, the relationships of $x \geq 0$, $y \leq 0.5$, and $x < y$ are preferred.

Generally, examples of methods of forming a functionalized thin film on a base mainly include physical vapor growth methods and chemical vapor growth methods (chemical vapor deposition methods). The physical vapor growth methods are methods of depositing a thin film of a substance of interest (for example, such as a carbon film) on a surface of a substance in a vapor phase by a physical procedure, and these methods are vapor deposition methods (resistance heating method, electron beam deposition method, molecular beam epitaxy method), ion plating methods, sputtering methods, and the like. On the other hand, the chemical vapor growth methods (chemical vapor deposition methods, Chemical Vapor Deposition) are methods of supplying a source gas containing the components of a thin film of interest onto a base to deposit a film by a chemical reaction on a substrate surface or in a vapor phase. Further, there are, e.g., methods of generating plasma for the purpose of activating a chemical reaction, examples thereof include known CVD manners such as heat CVD methods, catalytic chemical vapor growth methods, photo CVD methods, vacuum plasma CVD methods, and atmospheric pressure plasma CVD methods; and the like. Among the above-mentioned methods for forming a functionalized thin film, any method for forming the first gas barrier layer according to the present invention may be used, a sputtering method, a vacuum plasma CVD method, or an atmospheric pressure plasma CVD method is preferred, a vacuum plasma CVD method or an atmospheric pressure plasma CVD method is more preferred, and an atmospheric pressure plasma CVD method is further preferred.

According to the vacuum plasma CVD method and the atmospheric pressure plasma CVD method as described above, as for the first gas barrier layer to be obtained, the constitution of the first gas barrier layer can be controlled by appropriately selecting an organometallic compound and a decomposition gas, which are used, and reacting them under preferably conditions. Examples of components of the first gas barrier layer which can be controlled include metal carbides, metal nitrides, metal oxides, metal sulfides, metal halides, and mixtures thereof (such as metal oxynitrides, metal oxide-halides, and metal nitride-carbides). Silicon oxide is generated, for example, by using a silicon compound as the organometallic compound and oxygen as the decomposition gas and carrying out a vacuum plasma CVD method or an atmospheric pressure plasma CVD method under preferable conditions. Further, zinc disulfide is generated by using a zinc compound as the organometallic compound and carbon disulfide as the decomposition gas and carrying out a vacuum plasma CVD method or an atmospheric pressure plasma CVD method under preferable conditions. The reason which such a phenomenon occurs is considered to be that very active charged particles/active radicals are present at high density in plasma space, a multi-stage chemical reaction proceeds at a very high speed, and elements present in the plasma space are therefore converted into a thermodynamically stable compound in a short time.

Examples of organometallic compounds which can be used by vacuum plasma CVD methods and atmospheric pressure plasma CVD methods include, but are not particularly limited to, silicon compounds, titanium compounds, zirconium compounds, aluminum compounds, boron compounds, tin compounds, and other organometallic compounds. Specific examples of the silicon compounds include silane, tetramethoxysilane, tetraethoxysilane, tetra-n-propoxysilane, tetraisopropoxysilane, tetra-n-butoxysilane, tetra-t-butoxysilane, dimethyldimethoxysilane, dimethyldiethoxysilane, diethyldimethoxysilane, diphenyldimethoxysilane, methyltriethoxysilane, ethyltrimethoxysilane, phenyltriethoxysilane, (3,3,3-trifluoropropyl)trimethoxysilane, hexamethyldisiloxane, bis(dimethylamino)dimethylsilane, bis(dimethylamino)methylvinylsilane, bis(ethylamino)dimethylsilane, N,O-bis(trimethylsilyl)acetamide, bis(trimethylsilyl)carbodiimide, diethylaminotrimethylsilane, dimethylaminodimethylsilane, hexamethyldisilazane, heaxamethylcyclotrisilazane, heptamethyldisilazane, nonamethyltrisilazane, octamethylcyclotetrasilazane, tetrakisdimethylaminosilane, tetraisocyanatesilane, tetramethyldisilazane, tris(dimethylamino)silane, triethoxyfluorosilane, allyldimethylsilane, allyltrimethylsilane, benzyltrimethylsilane, bis(trimethylsilyl)acetylene, 1,4-bistrimethylsilyl-1,3-butadiine, di-t-butylsilane, 1,3-disilabutane, bis(trimethylsilyl)methane, cyclopentadienyltrimethylsilane, phenyldimethylsilane, phenyltrimethylsilane, propargyltrimethylsilane, tetramethylsilane, trimethylsilylacetylene, 1-(trimethylsilyl)-1-propine, tris(trimethylsilyl)methane, tris(trimethylsilyl)silane, vinyltrimethylsilane, hexamethyldisilane, octamethylcyclotetrasiloxane, tetramethylcyclotetrasiloxane, hexamethylcyclotetrasiloxane, M silicate 51, and the like. Examples of the titanium compounds include titanium methoxide, titanium ethoxide, titanium isopropoxide, titanium tetraisopropoxide, titanium-n-butoxide, titanium diisopropoxide(bis-2,4-pentanedionate), titanium diisopropoxide (bis-2,4-ethylacetoacetate), titanium di-n-butoxide(bis-2,4-pentanedionate), titanium acetylacetonate, butyl titanate dimer, and the like. Examples of the zirconium compounds include zirconium-n-propoxide, zirconium-n-butoxide, zirconium-t-butoxide, zirconium tri-n-butoxide acetylacetonate, zirconium di-n-butoxide bisacetylacetonate, zirconium acetylacetonate, zirconium acetate, zirconium hexafluoropentanedionate, and the like. Examples of the aluminum compounds include aluminum ethoxide, aluminum triisopropoxide, aluminum isopropoxide, aluminum-n-butoxide, aluminum-s-butoxide, aluminum-t-butoxide, aluminum acetylacetonate, triethyldialuminum tri-s-butoxide, and the like. Examples of the boron compounds include diborane, tetraborane, boron fluoride, boron chloride, boron bromide, borane-diethyl ether complex, borane-THF complex, borane-dimethyl sulfide complex, boron trifluoride diethyl ether complex, triethylborane, trimethoxyborane, triethoxyborane, tri(isopropoxy)borane, borazol, trimethylborazol, triethylborazol, triisopropylborazol, and the like. Examples of the tin compounds include tetraethyltin, tetramethyltin, diaceto-di-n-butyltin, tetrabutyltin, tetraoctyltin, tetraethoxytin, methyltriethoxytin, diethyldiethoxytin, triisopropylethoxytin, diethyltin, dimethyltin, diisopropyltin, dibutyltin, diethoxytin, dimethoxytin, diisopropoxytin, dibutoxytin, tin dibutylate, tin diacetoacetonate, ethyltin acetoacetonate, ethoxytin acetoacetonate, dimethyltin diacetoacetonate, tin dichloride, tin tetrachloride, and the like. Examples of the other organometallic compounds include antimony ethoxide, arsenic triethoxide, barium-2,2,6,6-tetramethylheptanedionate, beryllium acetylacetonate, bismuth hexafluoropentanedionate, dimethylcadmium, calcium-2,2,6,6-tetramethylheptanedionate, chromium trifluoropentanedionate, cobalt acetylacetonate, copper hexafluoropentanedionate, magnesium hexafluoropentanedionate-dimethylether complex, gallium ethoxide, tetraethoxygermane, tetramethoxygermane, hafnium-t-butoxide, hafnium ethoxide, indium acetylacetonate, indium-2,6-dimethylaminoheptanedionate, ferrocene, lanthanum isopropoxide, lead acetate, tetraethyllead, neodymium acetylacetonate, platinum hexafluoropentanedionate, trimethylcyclopentadienyl-platinum, rhodium dicarbonylacetylacetonate, strontium-2,2,6,6-tetramethylheptanedionate, tantalum methoxide, tantalum trifluoroethoxide, tellurium ethoxide, tungsten ethoxide, vanadium triisopropoxideoxide, magnesium hexafluoroacetylacetonate, zinc acetylacetonate, diethylzinc, and the like.

Examples of decomposition gases which can be used in vacuum plasma CVD methods and atmospheric pressure plasma CVD methods include, but are not particularly limited to, hydrogen gas, methane gas, acetylene gas, carbon monoxide gas, carbon dioxide gas, nitrogen gas, ammonium gas, nitrogen monoxide gas, nitrogen oxide gas, nitrogen dioxide gas, oxygen gas, moisture vapor, fluorine gas, hydrogen fluoride, trifluoroalcohol, trifluorotoluene, hydrogen sulfide, sulfur dioxide, carbon disulfide, chlorine gas, and the like.

A vacuum plasma CVD method will be specifically described below.

FIG. 1 is a schematic view illustrating an example of a vacuum plasma CVD apparatus used for forming a first gas barrier layer according to the present invention.

In FIG. 1, a vacuum plasma CVD apparatus 101 includes a vacuum tank 102 and a susceptor 105 is placed on the bottom surface side of the inside of the vacuum tank 102. Further, a cathode electrode 103 is placed at a position, facing the susceptor 105, on the ceiling side of the inside of the vacuum tank 102.

A heat medium circulating system 106, a vacuum exhaust system 107, a gas introduction system 108, and a high frequency power source 109 are placed outside the vacuum tank 102. A heat medium is placed in the heat medium circulating system 106. A heating cooling apparatus 160 including a pump which moves the heat medium, a heating apparatus which heats the heat medium, a cooling apparatus which cools it, a temperature sensor which measures the temperature of the heat medium, and a memory apparatus which memorizes a set temperature for the heat medium is disposed in the heat medium circulating system 106.

The heating cooling apparatus 160 is constituted to measure the temperature of the heat medium, to heat or cool the heat medium to the memorized set temperature, and to supply the heat medium to the susceptor 105. The supplied heat medium flows into the susceptor 105, heats or cools the susceptor 105, and returns to the heating cooling apparatus 160. The temperature of the heat medium is higher or lower than the set temperature when this occurs, and the heating cooling apparatus 160 heats or cools the heat medium to the set temperature and supplies the heat medium to the susceptor 105. A cooling medium is circulated between the susceptor and the heating cooling apparatus 160 in this manner and the susceptor 105 is heated or cooled by the supplied heat medium at the set temperature.

The vacuum tank 102 is connected to the vacuum exhaust system 107, and, prior to starting film formation treatment by the plasma CVD apparatus 101, the heat medium has been heated to increase its temperature from room temperature to the set temperature while preevacuating the inside of the vacuum tank 102 and the heat medium at the set temperature has been supplied to the susceptor 105. The susceptor 105 is at room temperature when beginning to be used and the supply of the heat medium at the set temperature results in increase the temperature of the susceptor 105.

The heat medium at the set temperature is circulated for given time and a substrate 110 to be film-formed is thereafter conveyed into the vacuum tank 102 while maintaining vacuum atmosphere in the vacuum tank 102 and is placed on the susceptor 105.

A large number of nozzles (pore) are formed in the surface, facing the susceptor 105 of the cathode electrode 103.

The cathode electrode 103 is connected to the gas introduction system 108, and a CVD gas is sprouted from the nozzles of the cathode electrode 103 into the vacuum tank 102 with vacuum atmosphere by introducing the CVD gas from the gas introduction system 108 into the cathode electrode 103.

The cathode electrode 103 is connected to the high frequency power source 109 and the susceptor 105 and the vacuum tank 102 are connected to a ground potential.

Plasma of the introduced CVD gas is formed by supplying the CVD gas from the gas introduction system 108 into the vacuum tank 102, starting the high frequency power source 109 while supplying the heat medium at given temperature from the heating cooling apparatus 160 to the susceptor 105, and applying a high-frequency voltage to the cathode electrode 103.

When the CVD gas activated in the plasma arrives at the surface of the substrate 110 on the susceptor 105, a gas barrier layer which is a thin film grows on the surface of the substrate 110.

During the growth of the thin film, the thin film is formed in the state where the heat medium at the given temperature has been supplied from the heating cooling apparatus 160 to the susceptor 105 and the susceptor 105 is heated or cooled by the heat medium and maintained at given temperature. Generally, the lower limit temperature of growth temperature at which the thin film is formed depends on the film quality of the thin film while the upper limit temperature thereof depends on the permissible range of damage to the thin film that has been already formed on the substrate 110.

The lower limit temperature and the upper limit temperature depend on the material quality of the thin film to be formed, the material quality of the thin film that has been already formed, and/or the like, and the lower limit temperature is preferably 50° C. or more and the upper limit temperature is preferably not more than the heat-resistant temperature of the base to secure the film quality with a high gas barrier property when a SiN film or a SiON film that constitutes the first gas barrier layer according to the present invention is formed.

The correlation between the film quality of the thin film formed by the vacuum plasma CVD method and film formation temperature and the correlation between damage to an article to be film-formed (substrate 110) and film formation temperature are predetermined to determine the lower limit temperature and the upper limit temperature. For example, during a vacuum plasma CVD process, the lower limit temperature of the substrate 110 is 50° C. and the upper limit temperature thereof is 250° C.

Furthermore, when a high-frequency voltage of 13.56 MHz or more is applied to the cathode electrode 103 to form plasma, the relationship between the temperature of the heat medium supplied to the susceptor 105 and the temperature of the substrate 110 has been premeasured and the temperature of the heat medium supplied to the susceptor 105 has been determined to maintain the temperature of the substrate 110 at the lower limit temperature or more and the upper limit temperature or less during the vacuum plasma CVD process.

For example, it is set to memorize the lower limit temperature (50° C. in this case) and to supply the heat medium, of which the temperature is controlled to the lower limit temperature or more, to the susceptor 105. The heat medium flowing back from the susceptor 105 is heated or cooled and the heat medium at the set temperature of 50° C. is supplied to the susceptor 105. For example, a mixed gas of silane gas, ammonia gas and nitrogen gas is supplied as the CVD gas to form a SiN film in the state where the temperature condition of the substrate 110 is maintained at the lower limit temperature or more and the upper limit temperature or less.

Immediately after starting the vacuum plasma CVD apparatus 101, the susceptor 105 is at room temperature and the temperature of the heat medium flowing back from the susceptor 105 to the heating cooling apparatus 160 is lower than the set temperature. Thus, immediately after the start, the heating cooling apparatus 160 heats the heat medium flowing back to increase its temperature to the set temperature and supplies the heat medium to the susceptor 105. In this case, the susceptor 105 and the substrate 110 are heated by the heat medium to increase its temperature and the substrate 110 is maintained in the range of the lower limit temperature of more and the upper limit temperature or less.

The temperature of the susceptor 105 is increased due to heat flowing in from plasma by consecutively forming thin films on a plurality of substrates 110. In this case, the heat medium flowing back from the susceptor 105 to the heating cooling apparatus 160 has higher temperature than the lower limit temperature (50° C.) and the heating cooling apparatus 160 therefore cools the heat medium and supplies the heat medium at the set temperature to the susceptor 105. As a result, the thin films can be formed while maintaining the substrates 110 in the range of the lower limit temperature or more and the upper limit temperature or less.

As described above, the heating cooling apparatus 160 heats the heat medium in the case in which the temperature of the heat medium flowing back is lower than the set temperature and cools the heat medium in the case in which the temperature thereof is higher than the set temperature, the heat medium at the set temperature is supplied to the susceptor in both cases, and the substrate 110 is therefore maintained in the temperature range of the lower limit temperature or more and the upper limit temperature or less.

After formation of the thin film with a predetermined film thickness, the substrate 110 is conveyed outside the vacuum tank 102, a substrate 110 on which no film has been formed is conveyed into the vacuum tank 102, and a thin film is formed while supplying the heat medium at the set temperature in the same manner as described above.

Figure 2:
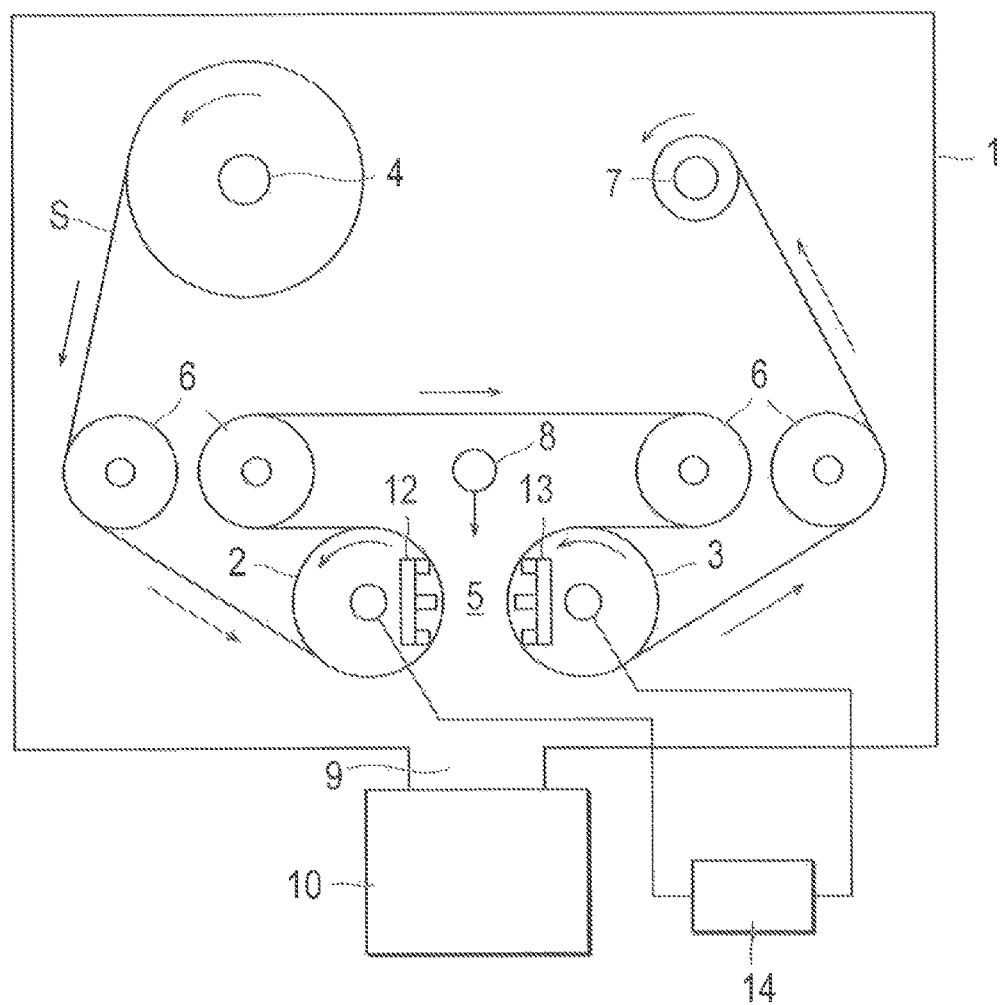
FIG. 2 is a schematic view illustrating an example of a vacuum plasma CVD apparatus in a roll-to-roll manner used in the present invention.

FIG. 2 is an example of a vacuum plasma CVD apparatus which is capable of forming a film in a roll-to-roll manner while continuously transporting a roll-shaped film base in a vacuum chamber and can also be preferably used in the present invention.

The vacuum plasma CVD apparatus illustrated in FIG. 2 includes a vacuum chamber 1; a pair of film formation rolls 2 and 3 placed to face each other so that their roll axes are parallel in the vacuum chamber 1; an unwind roll 4 for holding and unwinding a belt-shaped base S wound in a roll shape; a plurality of transport rolls 6 which transport the base S unwound from the unwind roll 4 to wind around the film formation rolls 2 and 3 to face one side or the other side of a facing space 5 between the film formation rolls 2 and 3; a wind-up roll 7 which winds up the base S after subjected to film formation; a film formation gas supply pipe 8 which is connected to a gas supply apparatus (not illustrated) and placed in parallel to roll axes just above the facing space 5; a vacuum exhaust port 9 which is opened in the bottom wall of the vacuum chamber 1; and a vacuum pump 10 which is connected in communication with the port. A plurality of gas blow nozzles directed at the facing space 5 are disposed in a lengthwise direction in the film formation gas supply pipe 8 and the vacuum exhaust port 9 is placed just below the facing space 5. Further, magnetic field generation members 12 and 13 are disposed in the film formation rolls 2 and 3, respectively, and a plasma power source 14 which supplies a plasma power to the film formation rolls 2 and 3 is disposed.

The atmospheric pressure plasma CVD method will be specifically described below.

The atmospheric pressure plasma CVD method is a method by which plasma CVD treatment is carried out at near atmosphere pressure and has high productivity without the need for reduction in pressure in an environment in which a thin film is formed, as well as a high film formation rate due to high plasma density in comparison with a plasma CVD method under vacuum. It further provides an extremely homogeneous film since the mean free step of a gas is very short under a high pressure condition such as atmospheric pressure in comparison with the conditions of an ordinary CVD method.

In the atmospheric pressure plasma CVD method, nitrogen gas or an element from Group 18 of the periodic table, specifically, helium, neon, argon, krypton, xenon, radon, or the like is used as a discharge gas. Of these, nitrogen, helium, and argon are preferably used, and, particularly, nitrogen is preferred also in view of the low cost.

Preferred embodiments of atmospheric pressure plasma treatment in which two or more electric fields with different frequencies are formed will be further described.

The atmospheric pressure plasma treatment preferably employs a manner in which two or more electric fields having different frequencies are formed in the discharge space by forming an electric field obtained by superposing a first high frequency electric field and a second high frequency electric field as described in International Publication No. WO 2007/026545.

Specifically, it is preferable that the frequency of the second high frequency electric field ω2 be higher than the frequency of the first high frequency electric field ω1, the relationship among the strength of the first high frequency electric field V1, the strength of the second high frequency electric field V2, and the strength of the discharge starting electric field IV meet V1≥IV>V2 or V1>IV≥V2 and the power density of the second high frequency electric field be 1 W/cm² or more.

By adopting such electric discharge conditions, for example, even a discharge gas having a high strength of the discharge starting electric field, such as nitrogen gas, can start discharge, a high density and stable plasma state can be maintained, and thin film formation with high performance can be carried out.

For example, when nitrogen is used as a discharge gas, the strength of a discharge starting electric field IV (½Vp–p) is around 3.7 kV/mm; and, therefore, nitrogen gas can be excited to cause a plasma state by applying an electric field of which the strength of the first high frequency electric field meets V1≥3.7 kV/mm in the above-described relationship.

As the frequency of the first power source, 200 kHz or less can be preferably used. Further, the waveform of the electric field may be a continuous wave or a pulse wave. The lower limit is desirably around 1 kHz.

On the other hand, as the frequency of the second power source, 800 kHz or more is preferably used. The higher the frequency of the second power source is, the higher the density of the plasma is, whereby a dense and high quality thin film can be obtained. The upper limit is desirably around 200 MHz.

The first high frequency electric field is necessary for starting the electric discharge of a discharge gas having a high strength of a discharge starting electric field, and a higher plasma density can be caused by the high frequency and the high power density of the second high frequency electric field. A dense and high quality thin film can be formed by forming high frequency electric fields from such two electric sources.

An atmospheric pressure or a near pressure thereof as used herein is around 20 kPa to 110 kPa and is preferably 93 kPa to 104 kPa for obtaining good effects described herein.

Further, the excited gas as used herein refers to a gas in which at least some of the molecules of the gas shift from a current energy state to a higher energy state by obtaining energy and corresponds to the gas containing excited gas molecules, radicalized gas molecules, or ionized gas molecules.

Examples of methods for forming the first gas barrier layer according to the present invention include a method of mixing a gas containing a source gas containing silicon with an excited discharge gas to form a secondary excited gas in discharge space in which a high frequency electric field is generated under atmospheric pressure or near pressure thereof and exposing a base to the secondary excited gas.

More specifically, space between counter electrodes (discharge space) is made to be at atmospheric pressure or near pressure thereof as a first step, the discharge gas is introduced between the counter electrodes, a high-frequency voltage is applied between the counter electrodes to make the discharge gas in a plasma state, the discharge gas in the plasma state is subsequently mixed with the source gas outside the discharge space, and the base is exposed to this mixed gas (secondary excited gas) to form the first gas barrier layer on the base.

The maximum value of y (nitrogen atom content) in the first gas barrier layer and the second gas barrier layer being present in the first gas barrier layer region, assuming that the composition of the first gas barrier layer is represented by $SiO_xN_y$, is preferred embodiment, but the details of the embodiment will be described below.

[Second Gas Barrier Layer]

The second gas barrier layer according to the present invention is formed by laminating and coating a coating liquid containing a polysilazane compound to be adjacent to the first gas barrier layer formed by a physical vapor deposition method or a chemical vapor deposition method.

(Coating Liquid Containing Polysilazane Compound)

The second gas barrier layer according to the present invention is formed by coating a coating liquid containing a polysilazane compound on the belt-shaped base on which the first gas barrier layer is formed.

As a coating method, any suitable methods may be adopted.

Specific examples include roll coating methods, flow coating methods, inkjet methods, spray coating methods, printing methods, dip coating methods, flow casting film formation methods, bar coating methods, gravure printing methods, and the like.

The thickness of a coating film is not particularly limited since it is suitably set depending on the purpose of use of a gas barrier film, but, for example, the thickness of the coating film may be set so that the thickness after drying is 50 nm or more, preferably 100 nm to 2 µm, more preferably 150 nm to 1 µm.

As used herein, "polysilazane compound", which is a polymer having a silicon-nitrogen bond in the structure, is a ceramic precursor inorganic polymer such as $SiO_2$, $Si_3N_4$, or an intermediate solid solution $SiO_xN_y$ therebetween which are composed of Si—N, Si—H, N—H, or the like.

For coating to prevent a film base from being damaged, a polysilazane compound converted into $SiO_xN_y$ at comparatively low temperature is preferred, as described in JP-A No. H08-112879.

There is preferably used such a polysilazane compound having the following structure:

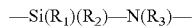

In the formula, $R_1$, $R_2$, and $R_3$ each represent a hydrogen atom, an alkyl group, an alkenyl group, a cycloalkyl group, an aryl group, an alkylsilyl group, an alkylamino group, or an alkoxy group.

In accordance with the present invention, the perhydropolysilazane in which all of $R_1$, $R_2$, and $R_2$ are hydrogen atoms is particularly preferred from the viewpoint of the denseness of an obtained gas barrier layer as a film.

On the other hand, organopolysilazane in which a part of a hydrogen moiety bound to Si thereof is substituted by an alkyl group has an advantage that adhesion with the undercoat base is improved and a hard and fragile ceramic film with polysilazane can be provided with toughness due to an alkyl group such as a methyl group to inhibit a crack from being generated even in the case of a larger film thickness.

These perhydropolysilazane and organopolysilazane may be appropriately selected or mixed and used, depending on the application.

Perhydropolysilazanes are estimated to have a structure in which a straight-chain structure and a ring structure including six- and/or eight-membered rings coexist.

As for the molecular weight of polysilazanes, they have a number average molecular weight (Mn) of around 600 to 2000 (in terms of polystyrene), and they are a liquid or solid substance, depending on the molecular weight.

These polysilazanes are marketed in the state of solutions in which they are dissolved in organic solvents and the commercially available products can be used as polysilazane-containing coating liquids without being processed.

Other examples of polysilazane compounds ceramized at low temperature include a silicon alkoxide-added polysilazane obtained by reacting the above-described polysilazane with silicon alkoxide (JP-A No. H05-238827), a glycidol-added polysilazane obtained by reaction with glycidol (JP-A No. H06-122852), an alcohol-added polysilazane obtained by reaction with alcohol (JP-A No. H06-240208), a metal carboxylate-added polysilazane obtained by reaction with a metal carboxylate (JP-A No. H06-299118), an acetylacetonato complex-added polysilazane obtained by reaction with an acetylacetonato complex containing a metal (JP-A No. H06-306329), a metallic fine particles-added polysilazane obtained by adding metallic fine particles (JP-A No. H07-196986), and the like.

It is preferable to avoid use of such an alcohol-based organic solvent or an organic solvent containing water, as easily reacted with polysilazane, as an organic solvent for preparing a coating liquid containing a polysilazane compound.

As organic solvents, for example, hydrocarbon solvents such as aliphatic hydrocarbons, alicyclic hydrocarbons, and aromatic hydrocarbons; halogenated hydrocarbon solvents; and ethers such as aliphatic ethers and alicyclic ethers can be used. Specific examples include hydrocarbons such as pentane, hexane, cyclohexane, toluene, xylene, solvesso, and turpentine, halogen hydrocarbons such as methylene chloride and trichloroethane; ethers such as dibutyl ether, dioxane, and tetrahydrofuran; and the like.

These organic solvents may be selected depending on purposes such as solubility of polysilazane and rates of evaporation of solvents and a plurality of organic solvents may also be mixed.

The concentration of a polysilazane compound in the polysilazane compound-containing coating liquid, which depends on the film thickness of the second gas barrier layer of interest and the pot life of the coating liquid, is around 0.2 to 35 weight %.

Amine or a metal catalyst may also be added into the coating liquid in order to promote the conversion into a silicon oxide compound. Specifically, examples include AQUAMICA NAX120-20, NN110, NN310, NN320, NL110A, NL120A, NL150A, NP110, NP140, SP140, and the like, manufactured by AZ Electronic Materials.

The amount of these added catalysts is preferably adjusted to 2 weight % or less based on the polysilazane compound in order to avoid excessive silanol formation due to the catalysts, reduction in film density, increase in the number of film defects, and the like.

The coating liquid containing the polysilazane compound may contain an inorganic precursor compound other than the polysilazane compound. The inorganic precursor compound other than the polysilazane compound is not particularly limited as long as the coating liquid can be prepared.

Specific examples of compounds comprising silicon may include polysiloxane, polysilsesquioxane, tetramethylsilane, trimethylmethoxysilane, dimethyldimethoxysilane, methyltrimethoxysilane, trimethylethoxysilane, dimethyldiethoxysilane, methyltriethoxysilane, tetramethoxysilane, tetramethoxysilane, hexamethyldisiloxane, hexamethyldisilazane, 1,1-dimethyl-1-silacyclobutane, trimethylvinylsilane, methoxydimethylvinylsilane, trimethoxyvinylsilane, ethyltrimethoxysilane, dimethyldivinylsilane, dimethylethoxyethynylsilane, diacetoxydimethylsilane, dimethoxymethyl-3,3,3-trifluoropropylsilane, 3,3,3-trifluoropropyltrimethoxysilane, aryltrimethoxysilane, ethoxydimethylvinylsilane, arylaminotrimethoxysilane, N-methyl-N-trimethylsilylacetamide, 3-aminoproylt-rimethoxysilane, methyltrivinylsilane, diacetoxymethylvinylsilane, methyltriacetoxysilane, aryloxydimethylvinylsilane, diethylvinylsilane, butyltrimethoxysilane, 3-aminopropyldimethylethoxysilane, tetravinylsilane, triacetoxyvinylsilane, tetraacetoxysilane, 3-trifluoroacetoxypropyltrimethoxysilane, diaryldimethoxysilane, butyldimethoxyvinylsilane, trimethyl-3-vinylthiopropylsilane, phenyltrimethylsilane, dimethoxymethylphenylsilane, phenyltrimethoxysilane, 3-acryloxypropyldimethoxymethylsilane, 3-acryloxypropyltrimethoxysilane, dimethylisopentyloxyvinylsilane, 2-aryloxyethylthiomethoxytrimethylsilane, 3-glycidoxypropyltrimethoxysilane, 3-arylaminopropyltrimethoxysilane, hexyltrimethoxysilane, heptadecafluorodecyltrimethoxysilane, dimethylethoxyphenylsilane, benzoyloxytrimethylsilane, 3-methacryloxypropyldimethoxymethylsilane, 3-methacryloxypropyltrimethoxysilane, 3-isocyanatepropyltriethoxysilane, dimethylethoxy-3-glycidoxypropylsilane, dibutoxydimethylsilane, 3-butylaminopropyltrimethylsilane, 3-dimethylaminopropyldiethoxymethylsilane, 2-(2-aminoethylthioethyl)triethoxysilane, bis(butylamino)dimethylsilane, divinylmethylphenylsilane, diacetoxymethylphenylsilane, dimethyl-p-tolylvinylsilane, p-styryltrimethoxysilane, diethylmethylphenylsilane, benzyldimethylethoxysilane, diethoxymethylphenylsilane, decylmethyldimethoxysilane, diethoxy-3-glycidoxypropyplmethylsilane, octyloxytrimethylsilane, phenyltrivinylsilane, tetraaryloxysilane, dodecyltrimethylsilane, diarylmethylphenylsilane, diphenylmethylvinylsilane, diphenylethoxymethylsilane, diacetoxydiphenylsilane, dibenzyldimethylsilane, diaryldiphenylsilane, octadecyltrimethylsilane, methyloctadecyldimethylsilane, docosylmethyldimethylsilane, 1,3-divinyl-1,1,3,3-tetramethyldisiloxane, 1,3-divinyl-1,1,3,3-tetramethyldisilazane, 1,4-bis(dimethylvinylsilyl)benzene, 1,3-bis(3-acetoxypropyl)tetramethyldisiloxane, 1,3,5-trimethyl-1,3,5-trivinylcyclotrisiloxane, 1,3,5-tris(3,3,3-trifluoropropyl)-1,3,5-trimethylcyclotrisiloxane, octamethylcyclotetrasiloxane, 1,3,5,7-tetraethoxy-1,3,5,7-tetramethylcyclotetrasiloxane, decamethylcyclopentasiloxane, and the like.

As the polysiloxane, which preferably has highly reactive Si—H, a methyl hydrogen polysiloxane is preferred. Examples of the methyl hydrogen polysiloxane may include TSF484 manufactured by Momentive Performance Materials Inc.

Polysilsesquioxanes having any cage-shaped, ladder-shaped, and random-shaped structures may be preferably used. Examples of polysilsesquioxanes with cage shapes may include Q8 series manufactured by Mayaterials, Inc.: Octakis(tetramethylammonium)pentacyclo-octasiloxane-octakis(yloxide)hydrate; Octa(tetramethylammonium)silsesquioxane, Octakis(dimethylsiloxy)octasilsesquioxane, Octa[[3-[(3-ethyl-3-oxetanyl)methoxy]propyl]dimethylsiloxy]octasilsequioxane; Octaallyloxetane silsesquioxane, Octa[(3-Propylglycidylether)dimethylsiloxy]silsesquioxane; Octakis[[3-(2,3-epoxypropoxy)propyl]dimethylsiloxy]octasilsesquioxane, Octakis[[2-(3,4-epoxycyclohexyl)ethyl]dimethylsiloxy]octasilsesquioxane, Octakis[2-(vinyl)dimethylsiloxy]silsesquioxane; Octakis(dimethylvinylsiloxy)octasilsesquioxane, Octakis[(3-hydroxypropyl)dimethylsiloxy]octasilsesquioxane, Octa[(methacryloylpropyl)dimethylsilyloxy]silsesquioxane, Octakis[(3-methacryloxypropyl)dimethylsiloxy]octasilsesquioxane; and the like. Examples of polysilsesquioxanes in which cage-shaped, ladder-shaped, and random-shaped structures are considered to be mixed and exist may include SR-20, SR-21 and SR-23 which are polyphenylsilsesquioxanes; SR-13 which is a polymethylsilsesquioxane; and SR-33 which is a polymethylphenylsilsesquioxane; which are manufactured by Konishi Chemical Ind. Co., Ltd. Also, Fox Series, manufactured by Dow Corning Toray Co., Ltd., which are polyhydrogensilsesquioxane solutions commercially available as spin-on glass materials may be preferably used.

Among the compounds described above, inorganic silicon compounds which are solid at ordinary temperature are preferred, and hydrogenated silsesquioxane is more preferably used.

(Vacuum Ultraviolet Ray Irradiation Step)

As for the second gas barrier layer according to the present invention, the gas barrier layer containing silicon nitride oxide represented by composition of $SiO_xN_y$ as the whole layer is formed by converting at least a part of polysilazane in the step of irradiating a coating film containing a polysilazane compound with a vacuum ultraviolet ray. As not represented by this composition formula in the presence of hydrogen and carbon, no carbon atom is preferably substantially present in the second gas barrier layer to obtain a good gas barrier property and a few hydrogen atoms are preferred for enhancing the stability of the second gas barrier layer.

In the second gas barrier layer of the gas barrier film according to the present invention, the distribution of the composition $SiO_xN_y$ satisfies the predetermined condition, namely, the condition in which the second gas barrier layer includes 50 nm or more of a region of $0.25 \leq x \leq 1.1$ and $0.4 \leq y \leq 0.75$ in the thickness direction. Specific explanation will be given below by taking perhydropolysilazane as an example.

Perhydropolysilazane can be represented by composition of "—$(SiH_2$—$NH)_n$—". In the representation by $SiO_xN_y$, the composition of the second gas barrier layer just after the coating has x=0 and y=1, and the supply of an oxygen source from the outside is necessary for x>0.

Examples of the oxygen supply source after the formation of the second gas barrier layer by a wet coating method include the following items:

(a) supply by oxygen or water contained in a polysilazane coating liquid;

(b) supply by oxygen or water taken into a coating film from the inside of an atmosphere in a coating drying process;

(c) supply by oxygen, water, ozone, or singlet oxygen taken in a coating film from the inside of an atmosphere in a vacuum ultraviolet ray irradiation step;

(d) supply by oxygen or water moving as an outgas from a base and an intermediate layer into a coating film by energy applied in a vacuum ultraviolet ray irradiation step;

(e) when a vacuum ultraviolet ray irradiation step is carried out in a non-oxidizing atmosphere, during moving from the non-oxidizing atmosphere to an oxidizing atmosphere, supply by oxygen or water taken from the atmosphere into a coating film; and the like.

On the other hand, the upper limit of y is basically 1 since the condition on which nitriding of Si proceeds compared with oxidation thereof is very special.

Further, x and y are basically in the range of $2x+3y \leq 4$ in view of the relationship of the bonding hands of Si, O, and N. In the state of y=0 in which oxidation has completely proceeded, a silanol group is contained in a coating film and the range of 2<x<2.5 may be established.

There will now be described a reaction mechanism in which it is estimated that perhydropolysilazane is generated in a vacuum ultraviolet ray irradiation step.

(I) Dehydrogenation, Formation of Si—N-Binding Therewith

It is considered that a Si—H bond or a N—H bond in perhydropolysilazane is relatively easily cleaved by, e.g., excitation due to irradiation with vacuum ultraviolet rays and is recombined as Si—N under an inert atmosphere (an uncombined hand of Si may be formed). That is, it is cured as $SiN_y$ composition without being oxidized. In this case, a polymer main chain is not cleaved. The cleavage of the Si—H bond or the N—H bond is promoted by the presence of a catalyst or by heating. Cleaved H is released as $H_2$ to the outside of a film.

(II) Formation of Si—O—Si Bond by Hydrolysis/Dehydrative Condensation

A Si—N bond in perhydropolysilazane is hydrolyzed with water and a polymer main chain is cleaved to form Si—OH. Two Si—OH moieties are subjected to dehydrative condensation to form a Si—O—Si bond to cause curing. This is a reaction which also occurs in atmospheric air but it is considered that moisture vapor generated as an outgas from a base by heat due to irradiation is a major water source during the irradiation with vacuum ultraviolet rays in an inert atmosphere. In the case of excessive water, Si—OH that cannot be completely subjected to dehydrative condensation remains to form a cured film having a low gas barrier property, represented by composition of $SiO_{2.1-2.3}$.

(III) Direct Oxidation and Formation of Si—O—Si Bond by Singlet Oxygen

When an adequate amount of oxygen exists under an atmosphere during irradiation with vacuum ultraviolet rays, singlet oxygen with very high oxidizability is formed. H and N in perhydropolysilazane are replaced by O to form a Si—O—Si bond to cause curing. It is considered that bond rearrangement may also be caused by cleaving a polymer main chain.

(IV) Oxidation with Si—N Bond Cleavage by Irradiation/Excitation with Vacuum Ultraviolet Rays It is considered that, since the energy of vacuum ultraviolet rays is higher than the bond energy of Si—N in perhydropolysilazane, a Si—N bond is cleaved and oxidized in the presence of an oxygen source (such as oxygen, ozone, or water) in surroundings to form a Si—O—Si bond (Si—O—N bond in some cases). It is considered that rearrangement of a bond may also be caused by cleaving a polymer main chain.

The second gas barrier layer according to the present invention includes 50 nm or more of a region of $0.25 \leq x \leq 1.1$ and $0.4 \leq y \leq 0.75$ in a thickness direction when the composition of the gas barrier layer is represented by $SiO_xN_y$. Accordingly, as mentioned above, the thickness of the second gas barrier layer is at least 50 nm or more, preferably 100 nm to 2 μm, more preferably 150 nm to 1 μm.

The composition distributions of the first gas barrier layer and the second gas barrier layer in the thickness direction can be measured and determined by a method using XPS analysis as described below.

Since the etch rates of the first gas barrier layer and the second gas barrier layer differ according to the compositions, the thickness in the XPS analysis in accordance with the present invention is temporarily determined based on the etch rate in terms of $SiO_2$, and the thicknesses of the first gas barrier layer and the second gas barrier layer are determined, respectively, by the cross section TEM images of an identical sample. Regions corresponding to the first gas barrier layer and the second gas barrier layer in the composition distributions in the thickness direction are specified while comparing the thicknesses with the composition distributions determined by the XPS analysis in the thickness direction, and the thickness of the region corresponding to the first gas barrier layer and the thickness of the region corresponding to the second gas barrier layer are corrected in the thickness direction by being uniformly multiplied by a coefficient to individually each match the film thicknesses determined by the cross section TEM images.

Although the XPS analysis in accordance with the present invention was carried out under conditions described below, a measurement method for the purpose of the present invention is applicable without any problem even if an apparatus or a measurement condition is changed.

The measurement method for the purpose of the present invention is mainly on resolution in a thickness direction, and an etch depth per measurement point (equivalent to the condition of sputtered ions and a depth profile as described below) is preferably 1 to 15 nm, more preferably 1 to 10 nm. In the following conditions, the etch depth per measurement point (etch rate) is equivalent to 5.12 nm in terms of $SiO_2$.

Further, the composition of the surface layer of the gas barrier layer according to the present invention is obtained by measurement after sputtering a gas barrier layer surface for 1 minute on the following conditions:

« XPS Analysis Condition »

Apparatus: QUANTERA SXM manufactured by ULVAC-PHI, Inc.

X-ray source: Monochromatized Al—Kα

Measurement regions: Si2p, C1s, N1s, O1s

Sputtered ions: Ar (2 keV)

Depth profile: Measurement is repeated after sputtering for 1 minute.

Quantitation: A background was determined by the Shirley method to conduct quantitation using a relative sensibility coefficient method from an obtained peak area. Multi Pak manufactured by ULVAC-PHI, Inc. was used for data processing.

The region in which the compositions x and y of the second gas barrier layer are in the above-described range is a region which has a good gas barrier property and can be reacted generally with moisture vapor and oxidized for a long term. It has a few defects and a good gas barrier property since it is a coating film formed by coating. The second gas barrier layer can capture moisture vapor without substantially passing it from this region, for example, into the region where an electronic device element is present, since it is gradually reacted and oxidized while suppressing the diffusion of moisture vapor infiltrating through the defects and the like of the first gas barrier layer. This region can continuously capture moisture vapor for a longer term than the term of the guarantee of the electronic device if it is 50 nm or more. A moisture vapor capture layer does not have the particularly set upper limit but is preferably 1.0 μm or less and more preferably 500 nm or less since a film thickness capable of carrying out good conversion is limited in a vacuum-ultraviolet light irradiation step.

When x is less than 0.25, there is a concern that conversion is insufficient and there is a concern that, although it has a high moisture vapor capture ability (ability of being able to be oxidized), a gas barrier property becomes insufficient, a moisture vapor transmission rate is increased, and the duration of capturing moisture vapor is decreased. In the above-mentioned conversion estimation mechanism, the oxidation during the conversion may cleave a —Si—N—Si— bond, which is the main chain of polysilazane, to replace O by N, and it is considered that, in this case, the bond of the converted polysilazane getting to have a lower molecular weight is recombined as a denser structure. Accordingly, it is considered that a sufficient gas barrier property is not obtained when a fixed amount of O is not present. When x is more than 1.1, since a moisture vapor capture ability (ability of being able to be oxidized) is greatly deteriorated although a gas barrier property is obtained, as a result, a moisture vapor transmission rate for a gas barrier layer is increased.

Similarly, in the case of y of less than 0.4, which is corresponds to the case in which the oxidation of polysilazane excessively proceeds, since a moisture vapor capture ability (ability of being able to be oxidized) is greatly deteriorated although a gas barrier property is obtained, as a result, a moisture vapor transmission rate for a gas barrier layer is increased. When y is more than 0.75, there is a concern that conversion is insufficient and there is a concern that, although it has a high moisture vapor capture ability (ability of being able to be oxidized), a gas barrier property becomes insufficient, a moisture vapor transmission rate is increased, and the duration of capturing moisture vapor is decreased.

In the composition $SiO_xN_y$ of the second gas barrier layer, x and y being in the ranges of $0.25 \leq x \leq 0.55$ and $0.55 \leq y \leq 0.75$ are further more preferred aspects, the balance between a gas barrier property and a moisture vapor capture ability (ability of being able to be oxidized) is further improved, and moisture vapor transmission rate for a gas barrier layer is therefore the most reduced.

Specific means for achieving (A) "condition on which the second gas barrier layer includes 50 nm or more of a region of $0.25 \leq x \leq 1.1$ and $0.4 \leq y \leq 0.75$ in the thickness direction" defined in the present invention, namely, means for controlling values of x and y will be described below. Examples of the means for controlling values of x and y include methods for appropriately controlling each of (a), (b), (c), (d), and (e) which are the above-mentioned oxygen supply sources. Although there have been examples of examining the control of (a), (b), and (c) until now, the composition of the conversion layer of polysilazane has not been able to be stably controlled in the scope of the present invention only thereby.

It was found that the control of (d) oxygen or water moving as an outgas from a base and an intermediate layer into a coating film by energy or the like applied in a vacuum ultraviolet ray irradiation step is a large control factor, particularly as a method for controlling x and y in the composition $SiO_xN_y$, in the conversion of polysilazane by the irradiation with vacuum ultraviolet rays in accordance with the present invention. It was further found that the moving amount of the outgas including the oxygen source diffusing from the base or the intermediate layer into the second gas barrier layer is greatly affected by the composition (characteristics such as a moisture vapor transmission rate) or film thickness of the first gas barrier layer located therebetween. For example, in order to enhance the x value in the second gas barrier layer, namely, to enhance an oxygen ratio, the amount of oxygen supplied to the second gas barrier layer can also be enhanced by decreasing the film thickness of the first gas barrier layer or by controlling the film composition (controlling oxygen permeability) of the first gas barrier layer.

In accordance with the present invention, it is preferable to control the above-described (d) by forming the composition of the first gas barrier layer, generally depending on the purpose. Since the control of the composition of the second gas barrier layer requires an oxygen source passing through the first gas barrier layer during irradiation with vacuum ultraviolet rays, very high performance is not required for the gas barrier property of the first gas barrier layer. Accordingly, the first gas barrier layer formed under the condition of a high film formation rate and higher productivity can also be preferably used.

As a preferred aspect to which the first gas barrier layer relates, the maximum value of y in the first gas barrier layer and the second gas barrier layer is preferably present in the region of the first gas barrier layer. In the first gas barrier layer, no moisture vapor capture ability (ability of being able to be oxidized) is demanded but the presence with stable composition is demanded. In general, it is considered that oxidation resistance is increased with increasing a nitrogen ratio in a silicon nitride oxide film formed by a gas phase method. What the maximum value of a y value in the first gas barrier layer and the second gas barrier layer being in the region of the first gas barrier layer becomes the index in which the first gas barrier layer has higher oxidation resistance than that of the second gas barrier layer. Using a silicon nitride film as the first gas barrier layer (meaning that the film is formed without introducing any oxygen source) is also one of preferred aspects.

Also, it is a large merit that, when the composition of the first gas barrier layer is a layer containing Si and N which are the same as those of polysilazane, the interface between the first gas barrier layer and the second gas barrier layer is bound with similar composition, adhesiveness therefore becomes very good, and a defect present in the first gas barrier layer can be repaired by infiltrating a material with similar composition, so that the effect of improving a gas barrier property by lamination becomes very high.

Furthermore, examples of characteristics of vacuum ultraviolet rays include a characteristic in that they are hardly absorbed in a $SiO_x$ layer and passed through the layer although they are absorbed in a $SiN_y$ layer in a thin film of several tens to 100 nm. In the vacuum ultraviolet ray irradiation step, when the first gas barrier layer is a $SiO_x$ layer, vacuum ultraviolet rays reaching the first gas barrier layer while being absorbed in the second gas barrier layer are hardly absorbed in the first gas barrier layer and therefore the first gas barrier layer does not energetically contribute to the conversion of polysilazane infiltrated into the above-described interface or defect portion. However, when the first gas barrier layer is a $SiO_xN_y$ layer or a $Sin_y$ layer as in the case of the present invention, since the surface layer of the first gas barrier layer also absorbs vacuum ultraviolet rays, for example, the generation of heat or the like is considered to contribute to the conversion of polysilazane infiltrated into the above-described interface or defect portion, and this is also considered to be one of the factors of making the effect of improving a gas barrier property by lamination become very high.

In the second gas barrier layer according to the present invention, the surface layer having $x/y \geq 6$ is a preferred aspect. In the vacuum ultraviolet ray irradiation step, the surface layer of the second gas barrier layer is most converted. This is because the surface layer receives the highest energy, and, in this case, a layer having $SiO_xN_y$ composition with a high oxygen ratio and having a very high barrier property is formed by taking an oxygen source in the atmosphere of the vacuum ultraviolet ray irradiation step. Since, in the second gas barrier layer, the high, barrier region of the surface layer is formed prior to or simultaneously with the conversion of the whole layer, the oxygen source in the atmosphere of the vacuum ultraviolet ray irradiation step cannot be substantially infiltrated inward from the high barrier region of this surface layer. Further, since the high barrier region of the surface layer is very stable against oxygen and moisture vapor, the moisture vapor capture ability (ability of being able to be oxidized) of the inside can be stably maintained without further forming another gas barrier layer on the second gas barrier layer. This means that it also has good storage stability for a gas barrier film before used as a sealing film for an electronic device. The surface layer having the composition of x/y≥6 causes this storage stability to be better.

In accordance with the present invention, as a method for controlling x/y in the surface layer to 6 or more, x/y can be increased by appropriately adjusting the concentration of oxygen in the atmosphere in the vacuum ultraviolet ray irradiation step of the second gas barrier layer, namely, by enhancing the concentration of the oxygen. In addition, x/y can be decreased by lowering the concentration of the oxygen.

The surface layer of the second gas barrier layer means a region from the second gas barrier surface to around 5 nm in a depth direction and x/y is specifically the average value of values obtained when the surface is analyzed by the XPS analysis.

In the vacuum ultraviolet ray irradiation step, the illuminance of the vacuum ultraviolet rays on the surface of the coating film, received by the second gas barrier layer coating film, is preferably 30 mW/cm$^2$ or more and 200 mW/cm$^2$ or less, more preferably 50 mW/cm$^2$ or more and 160 mW/cm$^2$ or less. The illuminance of 30 mW/cm$^2$ or less is preferred since conversion efficiency can be sufficiently secured. On the other hand, the illuminance of 200 mW/cm$^2$ or less is preferred since the ablation of the coating film and the damage of the base can be suppressed.

The amount of irradiation energy of vacuum ultraviolet rays on the surface of the second gas barrier layer coating film is preferably 200 mJ/cm$^2$ or more and 5000 mJ/cm$^2$ or less, more preferably 500 mJ/cm$^2$ or more and 3000 mJ/cm$^2$ or less. The amount of irradiation energy of 200 mJ/cm$^2$ or less is preferred since conversion can be sufficiently secured. On the other hand, the amount of irradiation energy of 5000 mJ/cm$^2$ or more is preferred since the generation of cracking due to excessive conversion and the heat deformation of the base can be suppressed.

As a vacuum ultraviolet light source, a noble gas excimer lamp is preferably used. A noble gas atom such as Xe, Kr, Ar, or Ne is not chemically bound to make a molecule and is therefore referred to as an inert gas.

However, a noble gas atom (excited atom) gaining energy by discharge and/or the like can be bound to another atom to make a molecule. When the noble gas is xenon, $$e + Xe \rightarrow Xe^*$$

$$Xe^* + 2Xe \rightarrow Xe_2^* + Xe$$

$$Xe_2^* \rightarrow Xe + Xe + h\nu (172\ nm)$$

are established, excimer light of 172 nm is emitted when transition of Xe$_2$*, which is an excited excimer molecule, to a ground state occurs.

Features of the excimer lamp include high efficiency due to concentration of emission on one wavelength to cause almost no emission of light other than necessary light. Further, the temperature of an object can be kept low since surplus light is not emitted. Furthermore, instant lighting and flashing are possible since time is not needed for starting/restarting.

A method of using dielectric barrier discharge is known to provide excimer light emission. The dielectric barrier discharge is very thin discharge called micro discharge, like thunder, generated in the gas space, which is disposed between both electrodes via a dielectric (transparent quartz in the case of the excimer lamp), by applying a high frequency and a high voltage of several tens of kHz to the electrodes, and, when a streamer of the micro discharge reaches a tube wall (dielectric), a dielectric surface is charged and the micro discharge therefore becomes extinct.

Excimer light emission is caused by spreading the micro discharge over the whole tube wall and repeating generation and extinction thereof. Therefore, light flicker which can be recognized even by the naked eye occurs. Since a streamer at very high temperature reaches locally directly the tube wall, deterioration in the tube wall may also be accelerated.

As the method of efficiently obtaining excimer light emission, a method in which electrodeless electric field discharge, other than the dielectric barrier discharge, is used also known. It is electrodeless electric field discharge by capacitive coupling and is also sometimes called RF discharge. Although a lamp, electrodes, and arrangement thereof may be basically the same as those in the dielectric barrier discharge, a high frequency applied between both electrodes at several of MHz cause to illuminate. In the electrodeless electric field discharge, discharge uniform in terms of space and time is obtained as described above and a long-lasting lamp without flicker is therefore obtained.

In the case of the dielectric barrier discharge, since micro discharge occurs only between the electrodes, the outside electrode must cover the whole external surface and have a material, through which light passes, for taking out light to the outside, in order to discharge in the whole discharge space.

Therefore, the electrode in which thin metal wires are reticulated is used. This electrode easily damaged by ozone and/or the like generated by vacuum-ultraviolet light in oxygen atmosphere since wires which are as thin as possible are used so as not to block light. For preventing this, it is necessary to take out irradiated light by disposing a window with synthetic quartz around the periphery of the lamp, that is, the inside of an irradiation apparatus have inert gas atmosphere such as nitrogen. The window with synthetic quartz is not only an expensive expendable product but also causes the loss of light.

Since a double cylinder type lamp has an outer diameter of around 25 mm, a difference between the distances to an irradiated surface just under a lamp axis and on the side surface of the lamp is unneglectable to cause a difference in illuminance. Accordingly, even if such lamps are closely arranged, no uniform illumination distribution is obtained. The irradiation apparatus provided with the window with synthetic quartz enables equal distances in oxygen atmosphere and provides a uniform illumination distribution.

It is not necessary to reticulate an external electrode when electrodeless electric field discharge is used. Only by disposing the external electrode on a part of the external surface of the lamp, glow discharge spreads over the whole discharge space. For the external electrode, an electrode which serves as a light reflecting plate typically made of an aluminum block is used on the back surface of the lamp. However, since the outer diameter of the lamp is large as in the case of the dielectric barrier discharge, synthetic quartz is required for making a uniform illumination distribution.

The maximum feature of a narrow tube excimer lamp is a simple structure. Both ends of a quartz tube are only closed to seal a gas for excimer light emission therein.

The tube of the narrow tube lamp has an outer diameter of around 6 nm to 12 mm, and a high voltage is needed for starting when it is too thick.

As discharge form, any of dielectric barrier discharge and electrodeless electric field discharge can be used. As for the shape of the electrode, a surface contacting with the lamp may be planar; however, the lamp can be well fixed and the electrode closely contacts with the lamp to more stabilize discharge by the shape fitting with the curved surface of the lamp. Further, a light reflecting plate can be also made when the curved surface is made to be a specular surface with aluminum.

A Xe excimer lamp is excellent in luminous efficiency since an ultraviolet ray with a short wavelength of 172 nm is radiated as a single wavelength. This light enables a high concentration of a radical oxygen atomic species or ozone to be generated with a very small amount of oxygen because of having a high oxygen absorption coefficient.

Further, the energy of light with a short wavelength of 172 nm which dissociates the bond of organic matter is known to have a high capacity. Conversion of a polysilazane film can be realized in a short time by the high energy of this active oxygen or ozone and ultraviolet radiation.

Accordingly, shortening of process time and reduction in the area of a facility, caused by a high throughput, and irradiation of an organic material, a plastic substrate, or the like, which is easily damaged by heat, are enabled in comparison with the low-pressure mercury lamp which emits wavelengths of 185 nm and 254 nm and the plasma cleaning.

The excimer lamp can be made to illuminate by input of a low power because of having high light generation efficiency. Further, it does not emit light with a long wavelength which becomes a factor for increasing temperature due to light but irradiates energy with a single wavelength in an ultraviolet range, and therefore has the feature of capable of suppressing increase in the surface temperature of an article to be irradiated. Therefore, it is suitable for a flexible film material such as PET which is considered to be subject to heat effect.

(Oxygen Concentration During Irradiation with Vacuum Ultraviolet Rays (VUV))

A reaction during irradiation with ultraviolet rays requires oxygen; however, since vacuum ultraviolet rays are prone to deteriorate efficiency in an ultraviolet ray irradiation step due to absorption by oxygen, it is preferable to perform the irradiation with vacuum ultraviolet rays in the state in which oxygen concentration is as low as possible.

The oxygen concentration during the irradiation with vacuum ultraviolet rays (VUV) according to the present invention is preferably 10 to 10000 ppm (1%), further preferably 50 to 5000 ppm.

As a gas filled in an irradiation atmosphere used during the irradiation with vacuum ultraviolet rays, a dry inert gas is preferred, and a dry nitrogen gas is particularly preferred from the viewpoint of a cost. The adjustment of the oxygen concentration can be performed by measuring the flow rates of an oxygen gas and an inert gas introduced into an irradiation house and changing a flow ratio.

[Overcoat Layer]

An overcoat layer may be disposed on the gas barrier layer according to the present invention.

(Material Used in Overcoat Layer)

As organic substances used in an overcoat layer, organic resins such as organic monomers, oligomers, and polymers can be preferably used. These organic resins preferably have a polymerizable group or a crosslinkable group, and a layer formed by coating with an organic resin composition coating liquid that contains these organic resins and optionally a polymerization initiator, a crosslinking agent, or the like is preferably subjected to light irradiation treatment or heat treatment to be cured. As used herein, "crosslinkable group" refers to a group capable of crosslinking a binding polymer by chemical reaction occurring in light irradiation treatment or heat treatment. The chemical structure thereof is not particularly limited as long as it is a group having such a function but examples of functional groups which can be subjected to addition polymerization include ethylenically unsaturated groups and cyclic ether groups such as epoxy groups/oxetanyl groups. They mal also be functional groups which can become radicals by light irradiation, and examples of such crosslinkable groups include a thiol group, a halogen atom, an onium salt structure, and the like. Especially, the ethylenically unsaturated groups are preferred, and examples thereof include functional groups described in Paragraphs 0130-0139 in JP-A No. 2007-17948.

The elasticity modulus of an overcoat layer can be adjusted to a desired value by appropriately adjusting the structure of an organic resin, the density of a polymerizable group, the density of a crosslinkable group, the ratio of a crosslinking agent, curing conditions, and the like.

Specific examples of organic resin compositions include a resin composition comprising an acrylate compound having a radical reactive unsaturated compound; a resin composition comprising an acrylate compound and a mercapto compound having a thiol group; a resin composition in which a polyfunctional acrylate monomer such as epoxy acrylate, urethane acrylate, polyester acrylate, polyether acrylate, polyethylene glycol acrylate, or glycerol methacrylate is dissolved; and the like. Such resin compositions as described above may also be optionally mixed and used and are not particularly limited as long as the mixture is a photosensitive resin containing a reactive monomer having one or more photopolymerizable unsaturated bonds in a molecule.

Examples of the reactive monomer having one or more of the photopolymerizable unsaturated bonds in the molecule include methyl acrylate, ethyl acrylate, n-propyl acrylate, isopropyl acrylate, n-butyl acrylate, isobutyl acrylate, tert-butyl acrylate, n-pentyl acrylate, n-hexyl acrylate, 2-ethyl hexyl acrylate, n-octyl acrylate, n-decyl acrylate, hydroxyethyl acrylate, hydroxypropyl acrylate, allyl acrylate, benzyl acrylate, butoxyethyl acrylate, butoxyethylene glycol acrylate, cyclohexyl acrylate, dicyclopentanyl acrylate, 2-ethyl hexyl acrylate, glycerol acrylate, glycidyl acrylate, 2-hydroxyethyl acrylate, 2-hydroxypropyl acrylate, isobornyl acrylate, isodecyl acrylate, isooctyl acrylate, lauryl acrylate, 2-methoxyethyl acrylate, methoxy ethylene glycol acrylate, phenoxy ethyl acrylate, stearyl acrylate, ethylene glycol diacrylate, diethylene glycol diacrylate, 1,4-butanediol diacrylate, 1,5-pentanediol diacrylate, 1,6-hexadiol diacrylate, 1,3-propanediol acrylate, 1,4-cyclohexanediol diacrylate, 2,2-dimethylolpropane diacrylate, glycerol diacrylate, tripropylene glycol diacrylate, glycerol triacrylate, trimethylolpropane triacrylate, polyoxyethyl trimethylolpropane triacrylate, pentaerythritol triacrylate, pentaerythritol tetraacrylate, ethylene oxide modified pentaerythritol triacrylate, ethylene oxide modified pentaerythritol tetraacrylate, propione oxide modified pentaerythritol triacrylate, propione oxide modified pentaerythritol tetraacrylate, triethylene glycol diacrylate, polyoxypropyl trimethylolpropane triacrylate, butylene glycol diacrylate, 1,2,4-butanediol triacrylate, 2,2,4-trimethyl-1,3-pentadiol diacrylate, diallyl fumarate, 1,10-decanediol dimethylacrylate, pentaerythritol hexaacrylate, and monomers obtained by substituting the above-described acrylates by methacrylates, γ-methacryloxypropyltrimethoxysilane, 1-vinyl-2-pyrrolidone, and the like. The above-described reactive monomers may be used singly or as mixtures of two or more kinds thereof or as mixtures with other compounds.

A composition of the above-described photosensitive resin contains a photopolymerization initiator. Examples of the photopolymerization initiator include benzophenone, methyl o-benzoylbenzoate, 4,4-bis(dimethylamine)benzophenone, 4,4-bis(diethylamine)benzophenone, α-aminoacetophenone, 4,4-dichlorobenzophenone, 4-benzoyl-4-methyldiphenyl ketone, dibenzyl ketone, fluorenone, 2,2-diethoxyacetophenone, 2,2-dimethoxy-2-phenylacetophenone, 2-hydroxy-2-methylpropiophenone, p-tert-butyldichloroacetophenone, thioxanthone, 2-methylthioxanthone, 2-chlorothioxanthone, 2-isopropylthioxanthone, diethylthioxanthone, benzyldimethyl ketal, benzylmethoxyethyl acetal, benzoin methyl ether, benzoin butyl ether, anthraquinone, 2-tert-butylanthraquinone, 2-amylanthraquinone, β-chloroanthraquinone, anthrone, benzanthrone, dibenzosuberone, methyleneanthrone, 4-azidobenzylacetophenone, 2,6-bis(p-azidebenzylidene)cyclohexane, 2,6-bis(p-azidebenzylidene)-4-methylcyclohexanone, 2-phenyl-1,2-butadione-2-(o-methoxycarbonyl)oxime, 1-phenyl-propanedione-2-(o-ethoxycarbonyl)oxime, 1,3-diphenyl-propanetrione-2-(o-ethoxycarbonyl)oxime, 1-phenyl-3-ethoxy-propanetrione-2-(o-benzoyl)oxime, Michler's ketone, 2-methyl[4-(methylthio)phenyl]-2-morpholino-1-propane, 2-benzyl-2-dimethylamino-1-(4-morpholinophenyl)-butanone-1, naphthalenesulfonyl chloride, quinolinesulfonyl chloride, n-phenylthioacridone, 4,4-azobisisobutyronitrile, diphenyl disulfide, benzthiazole disulfide, triphenylphosphine, camphorquinone, carbon tetrabromide, tribromophenylsulfone, benzoin peroxide, and Eosine, as well as combinations of a photoreductive pigment such as Methylene Blue and a reducing agent such as ascorbic acid or triethanolamine, and the like, which photopolymerization initiators may be used singly or in combination of two or more kinds thereof.

An inorganic material may be incorporated into the overcoat layer. The incorporation of the inorganic material generally leads to the increased elasticity modulus of the overcoat layer. The elasticity modules of the overcoat layer can also be adjusted to a desired value by appropriately adjusting the content ratio of the inorganic material.

As the inorganic material, inorganic fine particles with a number average particle diameter of 1 to 200 nm are preferred and inorganic fine particles with a number average particle diameter of 3 to 100 nm are more preferred. As the inorganic fine particles, metal oxides are preferred from the viewpoint of transparency.

Examples of the metal oxides include, but are not particularly limited to, $SiO_2$, $Al_2O_3$, $TiO_2$, $ZrO_2$, ZnO, $SnO_2$, $In_2O_3$, BaO, SrO, CaO, MgO, $VO_2$, $V_2O_5$, $CrO_2$, $MoO_2$, $MoO_3$, $MnO_2$, $Mn_2O_3$, $WO_3$, $LiMn_2O_4$, $Cd_2SnO_4$, $CdIn_2O_4$, $Zn_2SnO_4$, $ZnSnO_3$, $Zn_2In_2O_5$, $Cd_2SnO_4$, $CdIn_2O_4$, $Zn_2SnO_4$, $ZnSnO_3$, $Zn_2In_2O_5$, and the like. These may be used alone or in combination of two or more kinds.

In order to obtain the dispersion of inorganic fine particles, adjustment according to recent papers may be carried out while commercially available inorganic fine particle dispersions may also be preferably used.

Specific examples may include various metal oxide dispersions such as Snowtech series and organosilica sol manufactured by Nissan Chemical Industries, Ltd., NANOBYK series manufactured by BYK Japan KK, and NanoDur manufactured by Nanophase Technologies Corporation.

These inorganic fine particles, which are subjected to surface treatment, may also be used.

As inorganic materials, there can also be used tabular fine particles such as mica groups such as natural mica and synthetic mica, talc represented by $MgO.4SiO.H_2O$, teniolite, montmorillonite, saponite, hectorite, and zirconium phosphate.

Specific examples of the above-described natural mica include muscovite, paragonite, phlogopite, biotite, and lepidolite. Further, examples of the synthetic mica include non-swellable micas such as fluorine phlogopite $KMg_3(AlSi_3O_{10})F_2$ and potassium tetrasilic mica $KMg_{2.5}(Si_4O_{10})F_2$; swellable micas such as Na tetrasililic mica $NaMg_{2.5}(Si_4O_{10})F_2$; Na or Li teniolite $(Na, Li)Mg_2Li(Si_4O_{10})F_2$, and montmorillonite-based Na or Li hectorite $(Na, Li)_{1/8}Mg_{2/5}Li_{1/8}(Si_4O_{10})F_2$; and the like. Synthetic smectite is also useful.

The ratio of the inorganic material in the overcoat layer is preferably in a range of 10 to 95 weight %, more preferably in a range of 20 to 90 weight %, based on the total of the overcoat layer.

In the overcoat layer, a so-called coupling agent may be used alone or in admixture with another material. Examples of such a coupling agent include, without particular limitation, a silane coupling agent, a titanate-based coupling agent, an aluminate-based coupling agent, or the like, silane coupling agents are preferred from the viewpoint of the stability of a coating liquid.

Specific examples of the silane coupling agents include halogen-containing silane coupling agents (such as 2-chloroethyltrimethoxysilane, 2-chloroethyltriethoxysilane, 3-chloropropyltrimethoxysilane, and 3-chloropropyltriethoxysilane); epoxy group-containing silane coupling agents [such as 2-(3,4-epoxycyclohexyl)ethyltrimethoxysilane, 2-(3,4-epoxycyclohexyl)ethyltriethoxysilane, 3-(3,4-epoxycyclohexyl)propyltrimethoxysilane, 2-glycidyloxyethyltrimethoxysilane, 2-glycidyloxyethyltriethoxysilane, 3-glycidyloxypropyltrimethoxysilane, and 3-glycidyloxypropyltriethoxysilane]; amino group-containing silane coupling agents (such as 2-aminoethyltrimethoxysilane, 3-aminopropyltrimethoxysilane, 3-aminopropyltriethoxysilane, 2-[N-(2-aminoethyl)amino]ethyltrimethoxysilane, 3-[N-(2-aminoethyl)amino]propyltrimethoxysilane, 3-(2-aminoethyl)amino]propyltriethoxysilane, and 3-[N-(2-aminoethyl)amino]propyl methyl dimethoxysilane); mercapto group-containing silane coupling agents (such as 2-mercaptoethyltrimethoxysilane, 3-mercaptopropyltrimethoxysilane, and 3-mercaptopropyltriethoxysilane); vinyl group-containing silane coupling agents (such as vinyltrimethoxysilane and vinyltriethoxysilane); (meth) acryloyl group-containing silane coupling agents (such as 2-methacryloyloxyethyltrimethoxysilane, 2-methacryloyloxyethyltriethoxysilane, 2-acryloyloxyethyltrimethoxysilane, 3-methacryloyloxypropyltrimethoxysilane, 3-methacryloyloxypropyltriethoxysilane, and 3-acryloyloxypropyltrimethoxysilane); and the like. These silane coupling agents may be used alone or in combination of two or more kinds.

The overcoat layer is preferably formed by preparing a coating liquid by blending an organic resin, an inorganic material, and optionally another component with an appropriately optionally used diluting solvent, coating the coating liquid on the surface of a barrier layer by a coating method known in the art, and thereafter irradiating the liquid with ionizing radiation to cure the liquid. A method for irradiation with ionizing radiation can be performed by irradiation with ultraviolet rays in a wavelength region of 100 to 400 nm, preferably 200 to 400 nm, emitted from an ultra-high-pressure mercury lamp, a high-pressure mercury lamp, a low-pressure mercury lamp, a carbon arc, a metal halide lamp, or the like. Alternatively, it can be performed by irradiation with electron beams in a wavelength region of 100 nm or less, emitted from a scanning- or curtain-type electron beam accelerator.

«Applications of Gas Barrier Film»

The gas barrier film according to the present invention can be applied generally to packages for electronic devices and the like or display materials such as plastic substrates for organic EL elements, solar cells, liquid crystals, and the like, resin bases for various devices, and various device elements.

The gas barrier film of the present invention can also be preferably applied as various materials for sealing and films.

As an example of an electronic device including the gas barrier film of the present invention, an organic photoelectric conversion element will be described.

(Organic Photoelectric Conversion Element)

A gas barrier film is preferably transparent when used in an organic photoelectric conversion element, and such a constitution that the gas barrier film is used as a base (also referred to as a support) to receive sunlight from the surface side thereof is enabled.

That is, for example, a transparent conductive thin film such as ITO can be disposed as a transparent electrode on the gas barrier film of the present invention and can be constituted as a resin support for an organic photoelectric conversion element.

In addition, the ITO transparent conductive film disposed on the support is used as an anode, a porous semiconductor layer is disposed thereon, a cathode composed of a metal film is further formed to form an organic photoelectric conversion element, another sealing material (which may also be the same gas barrier film as that used in the support) is overlapped thereon, the gas barrier film support is adhered to the periphery thereof, thereby enabling the organic photoelectric conversion element to be sealed, and, as a result, the influence of a gas such as moisture or oxygen in outside air on the organic photoelectric conversion element can be blocked.

The resin support for an organic photoelectric conversion element is obtained by forming a transparent conductive film on the ceramic layer (barrier layer) (examples of the ceramic layer include a silicon oxide layer formed by conversion treatment of a polysilazane layer) of the gas barrier film formed in such a manner.

Formation of a transparent conductive film can be conducted by using a vacuum deposition method, a sputtering method, or the like and it can also be produced by a coating method such as a sol-gel method using, e.g., a metal alkoxide of indium, tin, or the like.

Further, as for the film thickness of the transparent conductive film, the transparent conductive film having the thickness in the range of 0.1 to 1000 nm is preferred.

Subsequently, each layer of an organic photoelectric conversion element material (constitution layer) constituting an organic photoelectric conversion element will be described.

(constitution of Organic Photoelectric Conversion Element and Solar Cell)

Preferred aspects of an organic photoelectric conversion element and a solar cell will be explained. In addition, preferred aspects of the organic photoelectric conversion element according to the present invention will be described in detail below, but the solar cell includes the organic photoelectric conversion element as the constitution thereof, and the preferred constitution of the solar cell can also be described as in the case of the organic photoelectric conversion element.

The organic photoelectric conversion element is not particularly limited, and it is preferably an element which has an anode, a cathode and at least one electric power generation layer ( a mixed layer of a p-type semiconductor and an n-type semiconductor, also referred to as a bulk heterojunction layer or an i layer) sandwiched between both, and generates electric current when irradiated with light.

Preferred specific examples of the layer constitution of the organic photoelectric conversion element (similar to the preferred layer constitution of the solar cell) will be described below.

(i) Anode/electric power generation layer/cathode (ii) Anode/hole transport layer/electric power generation layer/cathode (iii) Anode/hole transport layer/electric power generation layer/electron transport layer/cathode (iv) Anode/hole transport layer/p-type semiconductor layer/electric power generation layer/n-type semiconductor layer/electron transport layer/cathode (v) Anode/hole transport layer/first electric power generation layer/electron transport layer/intermediate electrode/hole transport layer/second electric power generation layer/electron transport layer/cathode.

The electric power generation layer needs to contain a p-type semiconductor material which can transport a hole, and an n-type semiconductor material which can transport an electron, and these materials may produce a heterojunction with substantially two layers or may produce a bulk heterojunction with one layer inside of which is of a mixed state, while the bulk heterojunction is preferred because of high photoelectric conversion efficiency. The p-type semiconductor material and the n-type semiconductor material used in the electric power generation layer will be described later.

As the same as the case of an organic EL element, the efficiency of taking out holes and electrons into the anode/cathode, respectively, can be improved by sandwiching the electric power generation layer with a hole transport layer and an electron transport layer and, therefore, the constitutions having those ((ii) and (iii)) are more preferred. As the electric power generation layer itself may enhance the rectification property of holes and electrons (selectivity of carriers taken out), a constitution in which the electric power generation layer is sandwiched between a layer containing a p-type semiconductor material alone and a layer containing an n-type semiconductor material alone as in (iv) (also referred to as p-i-n constitution) may be used. In order to raise the utilization efficiency of sunlight, it may also be of a tandem constitution (constitution in (v)) in which sunlight with different wavelengths is absorbed by respective electric power generation layers.

Materials constituting these layers will be explained below.

(Organic Photoelectric Conversion Element Material)

There will be described materials used for forming an electric power generation layer (also referred to as "photoelectric conversion layer") of an organic photoelectric conversion element.

<P-Type Semiconductor Material>

Examples of p-type semiconductor materials preferably used for an electric power generation layer (bulk heterojunction layer) in an organic photoelectric conversion element include various condensed polycyclic aromatic low molecular weight compounds and conjugated polymers and oligomers.

Examples of the condensed polycyclic aromatic low molecular weight compounds include compounds such as anthracene, tetracene, pentacene, hexacene, heptacene, chrysene, picene, fulminene, pyrene, peropyrene, perylene, terylene, quoterylene, coronene, ovalene, circumanthracene, bisanthene, zethrene, heptazethrene, pyranthrene, violanthene, isoviolanthene, circobiphenyl, and anthradithiophene; porphyrin, copper phthalocyanine, tetrathiafulvalene (TTF)-tetracyanoquinodimethane (TCNQ) complex, bisethyl-enetetrathiafulvalene (BEDTTTF)-perchloric acid complex; and derivatives and precursors thereof.

Examples of the derivatives containing the condensed polycyclic compounds described above include pentacene derivatives having a substituent described in International Publication No. WO 03/16599, International Publication No. WO 03/28125, U.S. Pat. No. 6,690,029, Japanese Patent Laid-Open No. 2004-107216, and the like, pentacene precursors described in US Pat. Application Publication No. 2003/136964; acene-based compounds substituted by a trialkylsilylethynyl group described in J. Amer. Chem. Soc., vol, vol 127. No 14. 4986, J. Amer. Chem. Soc., vol. 123, p 9482, J. Amer. Chem. Soc., vol. 130 (2008), No. 9, 2706, and the like; and the like.

Examples of the conjugated polymers include polymer materials such as, polythiophenes such as poly-3-hexylthiohene (P3HT) and oligomers thereof, polythiophenes having a polymerizable group described in Technical Digest of the International PVSEC-17, Fukuoka, Japan, 2007, P. 1225, polythiophene-thienothiophene copolymers described in Nature Material, (2006) vol. 5, p 328, polythiophene-diketopyrrolopyrrole copolymers described in International Publication No. WO 2008/000664, polythiophene-thiazolothiazole copolymers described in Adv Mater, 2007 p 4160, polythiophene copolymers such as PCPDTBT described in Nature Mat., vol. 6 (2007), p 497, polypyrroles and oligomers thereof, polyanilines, polyphenylenes and oligomers thereof, polyphenylenevinylenes and oligomers thereof, polythienylenevinylenes and oligomers thereof, polyacethylene, polydiacetylene, σ-conjugated polymers such as polysilane and polygerman.

As oligomer materials rather than polymer materials, oligomers such as: α-sexithioneneα,ω-dihexyl-α-sexithionene, α,ω-dihexyl-α-quinquethionene, and α,ω-bis(3-butoxypropyl)-α-sexithionene, which are thiophene hexamers, can be preferably used.

Among these compounds, preferred are compounds which have such high solubility into an organic solvent that a solution process can be carried out and which produce a crystalline thin film and can realize a high mobility after drying.

When an electron transporting layer is formed on an electric power generation layer by a coating method, since there may occur the problem that the solution for the electron transporting layer may dissolve the electric power generation layer, there can also be used such a material as to be insoluble after forming a layer in a solution process.

Examples of such materials may include materials insoluble through cross-linked polymerization after being coated, such as polythiophenes having a polymerizable group as described in Technical Digest of the International PVSEC-17, Fukuoka, Japan, 2007, p 1225; materials insoluble (to be pigments) by reaction of a soluble substituent by applying energy such as heat as described in US Pat. Application Publication No. 2003/136964, JP-A No. 2008-16834, and the like; and the like.

<N-Type Semiconductor Material>

Examples of n-type semiconductor materials used in the bulk heterojunction layer may include, but are not particularly limited to, e.g., fullerene, octaazaporphyrin, etc., a perfluoro compound which is a p-type semiconductor of which hydrogen atoms are replaced with fluorine atoms (such as perfluoropentacene or perfluorophthalocyanine), and a polymer compound which contains an aromatic carboxylic acid anhydride and its imide as a skeleton, such as naphthalenetetracarboxylic acid anhydride, naphthalenetetracarboxylic acid diimide, perylenetetracarboxylic acid anhydride, or perylenetetracarboxylic acid diimide.

However, preferred is a fullerene derivative which enables high speed (~50 fs) and effective charge separation with varieties of p-type semiconductor materials. Examples of the fullerene derivative may include fullerene C60, fullerene C70, fullerene C76, fullerene C78, fullerene C84, fullerene C240, fullerene C540, mixed fullerene, fullerene nano-tube, multilayered nano-tube, single-layered nano-tube, nano-horn (cone type), and the like, and a fullerene derivative obtained by substituting a part thereof with a hydrogen atom, a halogen atom, a substituted or unsubstituted alkyl group, an alkenyl group, an alkynyl group, an aryl group, a heteroaryl group, a cycloalkyl group, a silyl group, an ether group, a thioether group, an amino group, a silyl group, or the like.

Among these, it is preferable to use a fullerene derivative which has an improved solubility by having a substituents, such as [6,6]-phenyl $C_{61}$-butyric acid methyl ester (abbreviated name: PCBM), [6,6]-phenyl $C_{61}$-butyric acid-n-butyl ester (PCBnB), [6,6]-phenyl $C_{61}$-butyric acid-isobutyl ester (PCBiB), [6,6]-phenyl $C_{61}$-butyric acid n-hexyl ester (PCBH), bis-PCBM described in Adv. Mater., vol. 20 (2008), p 2116, amino fullerene described in JP-A No. 2006-199674, metallocene fullerene described in JP-A No. 2008-130889, and fullerene having a cyclic ether group described in U.S. Pat. No. 7,329,709.

(Hole Transport Layer/Electron-Blocking Layer)

The organic photoelectric conversion element according to the present invention preferably has the hole transport layer between the bulk heterojunction layer and the anode. It becomes possible to more effectively take out charges generated in the bulk heterojunction layer by having such a layer.

As materials constituting these layers, for example, for the hole transport layer, there can be used, for example: PEDOT (poly-3,4-ethylenedioxythiophene), such as BaytronP (trade name) manufactured by Starck Vitec; polyaniline and its dope material; a cyan compound described in International Publication No. WO 06/19270; and the like.

In addition, the hole transport layer which has a LUMO level shallower than the LUMO level of the n-type semiconductor material used in a bulk heterojunction layer is imparted with an electron-blocking function having an rectifying effect by which the electron generated in the bulk heterojunction layer is not passed to the anode side.

Such a hole transport layer is also called an electron-blocking layer, and it is more preferable to use a hole transport layer having such a function. Examples of these materials include triaryl amine-based compounds as described in JP-A No. H05-271166, metal oxides such as molybdenum oxide, nickel oxide and tungsten oxide, and the like.

Moreover, the layer which includes a p-type semiconductor material alone used in the bulk heterojunction layer can also be used. As means for forming these layers, although any one of a vacuum deposition method and a solution coating method can be used, preferably used is a solution coating method. When a coated film is formed as an under layer before forming the bulk heterojunction layer, it will have an effect of leveling the coating surface, and an effect such as leaking will be reduced, and it is therefore preferable.

(Electron Transport Layer/Hole-Blocking Layer)

The organic photoelectric conversion element preferably has the electron transport layer between the bulk heterojunction layer and the cathode. It becomes possible to more effectively take out charges generated in the bulk heterojunction layer by having such a layer.

As the electron transport layer, there can be used: octaazaporphyrin and a perfluoro compound of a p-type semiconductor (such as perfluoro pentacene or perfluoro phthalocyanine), and, similarly, the electron transport layer which has a HOMO level deeper than the HOMO level of the p-type semiconductor material used for a bulk heterojunction layer is imparted with a hole blocking function having an rectifying effect by which the hole generated in the bulk heterojunction layer is not passed to the cathode side.

Such an electron transport layer is also called a hole-blocking layer, and it is more preferable to use the electron transport layer which have such a function.

As such materials, there can be used phenanthrene-based compounds such as bathocuproine; n-type semiconductor materials such as naphthalenetetracarboxylic acid anhydride, naphthalenetetracarboxylic acid diimide, perylenetetracarboxylic acid anhydride and perylenetetracarboxylic acid diimide; n-type inorganic oxides such as titanium oxide, zinc oxide and gallium oxide; alkali metal compounds such as lithium fluoride, sodium fluoride and cesium fluoride; and the like.

Moreover, the layer including an n-type semiconductor material alone used in the bulk heterojunction layer can also be used. As means for forming these layers, although any one of a vacuum deposition method and a solution coating method can be used, preferably used is the solution coating method.

(Other Layers)

It is also preferable to have a constitution containing various intermediate layers in an element for the purpose of improvement in energy conversion efficiency and improvement in lifetime of the element. Examples of the interlayer may include hole-blocking layers, electron-blocking layers, hole injection layers, electron injection layers, exciton blocking layers, UV absorption layers, light reflection layers, wavelength conversion layers, and the like.

(Transparent Electrode (First Electrode))

The transparent electrode is not particularly limited to a cathode or an anode and can be selected according to an element constitution, but the transparent electrode is preferably used as an anode. For example, in the case of use as an anode, it is preferable to use an electrode which transmits light of 380 to 800 nm.

As materials, there can be used, for example, transparent conductive metal oxides such as indium tin oxide (ITO), $SnO_2$, and ZnO; metal thin films such as gold, silver, and platinum; metal nanowires; and carbon nanotubes.

Also usable is a conductive polymer selected from the group consisting of derivatives of: polypyrrole, polyaniline, polythiophene, polythienylene vinylene, polyazulene, polyisothianaphthene, polycarbazole, polyacethylene, polyphenylene, polyphenylene vinylene, polyacene, polyphenyl acetylene, polydiacetylene, and polynaphthalene. A transparent electrode can also be constructed by combining a plurality of these conductive compounds.

(Counter Electrode (Second Electrode))

A counter electrode may also be a sole layer of a conductive material, however, in addition to materials with conductivity, a resin may also be used in combination to hold the materials. As a conductive material for the counter electrode, a material in which a metal, an alloy, or an electric conductive compound, having a small work function (4 eV or less), or a mixture thereof is used as an electrode material.

Specific examples of such electrode materials include sodium, sodium-potassium alloy, magnesium, lithium, magnesium/copper mixtures, magnesium/silver mixtures, magnesium/aluminum mixtures, magnesium/indium mixtures, aluminum/aluminum oxide ($Al_2O_3$) mixtures, indium, lithium/aluminum mixtures, rare earth metals, and the like.

Among these, from the viewpoints of a taking out property of an electron and resistance to oxidation and/or the like, preferable is a mixture of these metals and the second metal which is a metal that has a larger work function and is more stable than these metals, for example, magnesium/silver mixture, a magnesium/aluminum mixture, a magnesium/indium mixture, an aluminum/aluminum oxide ($Al_2O_3$) mixture, a lithium/aluminum mixture, aluminum, or the like.

The counter electrode can be produced by forming a thin film by using a method such as vapor deposition or sputtering of the electrode materials. Further, the film thickness is generally selected from 10 nm to 5 μm, and preferably from 50 to 200 nm.

When a metallic material is used as a conductive material for a counter electrode, light reaching the counter electrode side is reflected to the first electrode side, this light becomes possible to be reused, it is again absorbed by a photoelectric conversion layer, and this is preferable because this results in more improvement in its photoelectric conversion efficiency.

The counter electrode may also be made of: a metal (for example, gold, silver, copper, platinum, rhodium, ruthenium, aluminum, magnesium, indium, or the like), nanoparticles made of carbon, nanowires, and a nano structure; and a dispersion of nanowires is preferable, since it can produce a transparent counter electrode having high electrical conductivity by a coating method.

When the counter electrode side is made light transmissive, after thinly producing a film of a conductive material suitable for a counter electrode, for example, aluminum and aluminum alloy, silver, a silver compound, and the like, having a film thickness of around 1 to 20 nm, a light transmissive counter electrode can be produced by disposing a film of a conductive light transmissive material cited for the description of the above-described transparent electrode.

(Intermediate Electrode)

As a material for an intermediate electrode which is needed in a tandem constitution such as (v) of the layer constitutions of the organic photoelectric conversion element, preferable is a layer using the compound having both transparency and electrical conductivity, and materials used for the above-mentioned transparent electrode are usable (a transparent metal oxide such as ITO, AZO, FTO, or titanium oxide; a very thin metal layers made of such as Ag, Al, and Au; a layer containing nanoparticles and nanowires; a conductive polymer material such as PEDOT: PSS or polyaniline; and the like).

In addition, among the aforementioned hole transport layer and electron transport layer, there may be a combination used as an intermediate electrode (electric charge recombination layer) when they are suitably combined and laminated with each other, and, when such a constitution is employed, it is preferable since a step for forming one layer can be eliminated.

(Metal Nanowire)

An organic or inorganic fiber coated with a metal, a conductive metal oxide fiber, a metal nanowire, a carbon fiber, a carbon nanotube, or the like can be used as the conductive fiber, and a metal nanowire is preferred.

Generally, a metal nanowire indicates a linear structure including a metallic element as a main component. In particular, the metal nanowire in accordance with the present invention means a linear structure having a diameter of a nanometer (nm) size.

In order to form a long conductive path by one metal nanowire and to express an appropriate light scattering property, a metal nanowire preferably has an average length of 3 µm or more, further preferably 3 µm to 500 µm, and particularly preferably 3 µm to 300 µm. In addition, the relative standard deviation of the length is preferably 40% or less.

Moreover, from the viewpoint of transparency, the average diameter is preferably smaller while the average diameter is preferably larger from the viewpoint of electrical conductivity. In accordance with the present invention, the average diameter of the metal nanowire is preferably from 10 nm to 300 nm, and more preferably from 30 nm to 200 nm. In addition, the relative standard deviation of the diameter is preferably 20% or less.

There is no restriction in particular to the metal composition of the metal nanowire, and it can be composed of one or a plurality of metals of noble metal elements or base metal elements (metal elements other than the noble metal elements); it preferably contains at least one metal belonging to the group consisting of noble metals (for example, gold, platinum, silver, palladium, rhodium, iridium, ruthenium, osmium, and the like), iron, cobalt, copper, and tin; and at least silver is preferably included in it from the viewpoint of electrical conductivity.

Moreover, for the purpose of achieving compatibility of conductivity and stability (sulfuration or oxidation resistance and migration resistance of metal nanowire), it also preferably contains silver and at least one metal belonging to the noble metals except silver. When the metal nanowire according to the present invention contains two or more metallic elements, for example, metal composition may be different between the surface and the inside of the metal nanowire or the whole metal nanowire may have the same metal composition.

There is no limitation in particular to means for producing a metal nanowire, but, for example, a known method such as a liquid phase method or a gas phase method may be used. There is also no limitation in particular to a specific production method, a known production method may be used.

For example, a method for producing an Ag nanowire may be referred to Adv. Mater., 2002, 14, 833-837; Chem. Mater., 2002, 14, 4736-4745, and the like; a method for producing an Au nanowire may be referred to JP-A No. 2006-233252 and the like; a method for producing a Cu nanowire may be referred to JP-A No. 2002-266007 and the like; and a method for producing a Co nanowire may be referred to JP-A No. 2004-149871 and the like. Particularly, the method for producing Ag nanowires, reported in Adv. Mater. and Chem. Mater. as mentioned above, may be preferably applied as a method for producing a silver nanowire, since it is possible to easily produce an Ag nanowire in an aqueous system and the electrical conductivity of silver is maximum of all metals.

A three-dimensional conductive network is produced by mutual contact of metal nanowires and high conductivity is expressed; light can penetrate the window part of the conductive network where no metal nanowire is present, and further, it becomes possible to perform efficiently the generation of electricity from the organic electric power generation layer portion by the scattering effect of the metal nanowires. It is a preferable embodiment to arrange a metal nanowire in a portion closer to the organic electric power generation layer portion in the first electrode because the scattering effect can be effectively utilized.

(Optical Function Layer)

The organic photoelectric conversion element may include various optical function layers for the purpose of efficiently receiving sunlight. As an optical function layer, there may be disposed, for example, an anti-reflection film; a light condensing layer such as a microlens array; a light diffusion layer which can scatter light reflected by the cathode and can make the light incident again on the electric power generation layer; and the like.

As anti-reflection layers, various known anti-reflection layers can be disposed; for example, when a transparent resin film is a biaxial stretching polyethylene terephthalate film, it is preferable to set the refractive index of the adhesion assisting layer, which is adjacent to the film, to be from 1.57 to 1.63 since this will improve transmittance by decreasing the interface reflection between the film substrate and the adhesion assisting layer. As a method of adjusting a refractive index, it can be carried out by appropriately adjusting the ratio of a binder resin to an oxide sol having a comparatively high refractive index such as a tin oxide sol or a cerium oxide sol and by coating it. Although the adhesion assisting layer may be a single layer, in order to improve an adhesion property, a constitution of two or more layers may also be used.

Regarding the light condensing layer, it is possible to increase an amount of the receiving light from a specific direction or, conversely, to reduce the incident angle dependency of sunlight by performing processing to dispose a structure on a microlens array on the sunlight receiving side of the supporting substrate or by using in combination with a so-called light condensing sheet.

As an example of a microlens array, there is made an arrangement in which the quadrangular pyramidal forms having a side of 30 µm and a vertex angle of 90 degrees are two-dimensionally arranged on the light taking out side of a substrate. The side is preferably in the range of 10 to 100 µm. When it is less than this range, the effect of diffraction will occur to result in coloring, while when it is more than this range, the thickness becomes large, whereby it is not preferable.

Further, examples of light scattering layers may include various anti-glare layers; layers in which nanoparticles, nanowires, and the like made of metals, various inorganic oxides, and the like are dispersed in colorless transparent polymers; and the like.

(Film Formation Method and Surface Treatment Method)

Examples of methods for producing a bulk heterojunction layer in which an electron acceptor and an electron donor are mixed, a transport layer and an electrode may include vapor deposition methods, coating methods (including cast methods and spin coat methods), and the like. Of these, examples of methods for producing a bulk heterojunction layer may include vapor deposition methods, coating methods (including cast methods and spin coat methods), and the like.

Among these, a coating method is preferred in order to increase the area of the interface which carries out charge separation of the above-mentioned hole and electron and to produce an element having high photoelectric conversion efficiency. Further, the coating method is also excellent in production speed.

Although there is no limitation in the coating method to be used in this case, examples of the method include spin coating methods, cast methods from a solution, dip coating methods, blade coating methods, wire bar coating methods, gravure coating methods, spray coating methods, and the like. Furthermore, patterning can also be carried out by printing methods such as inkjet methods, screen printing methods, letterpress printing methods, intaglio printing methods, offset printing methods, flexographic printing methods, and the like.

After coating, it is preferable to heat the film in order to remove the residual solvent, water, and a gas, as well as to improve the mobility and to shift the absorption in the longer wavelength due to crystallization of a semiconductor material. When annealing treatment is carried out at a predetermined temperature during a production step, microscopically partial aggregation or crystallization is promoted and a suitable phase separation structure can be made in a bulk heterojunction layer. As a result, the carrier mobility of the bulk heterojunction layer can be improved and high efficiency can be obtained.

The electric power generation layer (bulk heterojunction layer) may be constituted by a single layer containing a uniform mixture of an electron acceptor and an electron donor or may be constituted by a plurality of layers each having a different mixing ratio of an electron acceptor and an electron donor. In this case, the production is enabled by using such a material which becomes insoluble after coating as mentioned above.

(Patterning)

There is no limitation in particular in the method and the process of patterning an electrode, an electric power generation layer, a hole transport layer, an electron transport layer, and the like, and a known procedure can be applied appropriately.

In the case of a soluble material for a bulk heterojunction layer, a transport layer, or the like, only a unnecessary part may be wiped off after complete coating such as die coating or dip coating or it may be directly patterned during coating by using a method such as an inkjet method or a screen printing method.

In the case of an insoluble material such as an electrode material, mask deposition of an electrode can be performed during vacuum deposition or it can be patterned by a known method such as etching or lift-off. Further, it may also be possible to produce a pattern by transferring the pattern formed on another substrate.

EXAMPLES

The present invention will be specifically explained with reference to examples below but the present invention is not limited thereto. In addition, in examples, the expression of "part(s)" or "%" is used but, unless otherwise specified, represents "part(s) by weight" or "weight %".

Example 1

《 Production of Base 》

[Production of Base (a)]

A base (a) was prepared by using as the thermoplastic resin base (support), a polyester film having a thickness of 125 μm (Super low heat shrinkage PET Q83, manufactured by Teijin DuPont Films Japan Limited), both surfaces of which were subjected to adhesion-enhancing processing, and forming a bleedout preventing layer on one surface and a smooth layer on the other surface, as described below.

<Formation of Bleedout Preventing Layer>

On one surface of the thermoplastic resin base, a UV curable organic/inorganic hybrid hard coat material OPSTAR Z7535 manufactured by JSR Corporation was coated so that the film thickness after dried was 4.0 μm, followed by conducting curing treatment under a curing condition: an irradiation energy amount of 1.0 J/cm$^2$, under air atmosphere, and using a high-pressure mercury lamp, and a drying condition: 80° C. for 3 minutes to form a bleedout preventing layer.

<Formation of Smooth Layer>

Subsequently, on the surface opposite to the surface of the bleedout preventing layer of the above-described thermoplastic resin base was formed, a UV curable organic/inorganic hybrid hard coat material OPSTAR Z7501 manufactured by JSR Corporation was coated so that the film thickness after dried was 4.0 μm, followed by drying at 80° C. for 3 minutes, and then conducting irradiation and curing under air atmosphere using a high-pressure mercury lamp under a curing condition: an irradiation energy amount of 1.0 J/cm$^2$ to form a smooth layer.

The surface roughness Rz of the obtained smooth layer, measured according to a method specified in JIS B 0601, was about 25 nm.

The surface roughness was measured using AFM (atomic force microscope) SPI3800NDFM manufactured by SII. A measured range at one step was 80 μm×80 μm, three measurements were carried out on different measurement spots, and the average of Rz values obtained in the respective measurements was regarded as a measured value.

[Production of Base (b)]

A base (b) was prepared by using, as the heat-resistant base, a transparent polyimide-based film having a thickness of 200 μm (NEOPULIM L, manufactured by Mitsubishi Gas Chemical Company, Inc.), both surfaces of which were subjected to adhesion-enhancing processing, and forming a smooth layer on both surfaces, as described below.

(Formation of Smooth Layer)

<Production of Smooth Layer Coating Liquid>

8.0 g of trimethylolpropane triglycidyl ether (EPOLIGHT 100MF, manufactured by Kyoeisha Chemical Co., Ltd.), 5.0 g of ethylene glycol diglycidyl ether (EPOLIGHT 40E, manufactured by Kyoeisha Chemical Co., Ltd.), 12.0 g of silsesquioxane having an oxetanyl group: OX-SQ-H (manufactured by Toagosei Co., Ltd.), 32.5 g of 3-glycidoxypropyltrimethoxysilane, 2.2 g of Al(III)acetylacetonate, 134.0 g of methanol silica sol (manufactured by Nissan Chemical Industries, Ltd., solid content concentration of 30 weight %), 0.1 g of BYK333 (silicon-based surfactant, manufactured by BYK Japan KK), 125.0 g of butyl cellosolve, and 15.0 g of 0.1 mol/L aqueous hydrochloric acid solution were mixed, and the mixture was stirred sufficiently. The resultant was further left at rest and degassed at room temperature to obtain a smooth layer coating liquid.

<Formation of Smooth Layer 1>

One surface of the above-described heat-resistant base was subjected to corona discharge treatment by a usual method, then coated with the produced smooth layer coating liquid so that the film thickness after drying was 4.0 μm, and dried at 80° C. for 3 minutes. Heat treatment was further performed at 120° C. for 10 minutes to form a smooth layer 1.

<Formation of Smooth Layer 2>

A smooth layer 2 was formed on the surface opposite to the surface on which the smooth layer 1 of the above-described heat-resistant base was formed, in the same manner as the method for forming the smooth layer 1.

The surface roughnesses of the smooth layer 1 and the smooth layer 2 which were formed were measured by the same method as in the case of the base (a), and the surface roughnesses Rz were about 20 nm.

[Production of Base (c)]

A base (c) was produced by the same method as in the case of the base (b) except that SILPLUS H100 having a thickness of 100 μm, manufactured by Nippon Steel Chemical Co., Ltd., which was a film containing silsesquioxane having an organic-inorganic hybrid structure as a basic skeleton, was used as the heat-resistant base in the production of the above-described base (b). In addition, the surface roughnesses of the smooth layer 1 and the smooth layer 2 of the base (c) were measured by the same method as in the case of the base (a), and the surface roughnesses Rz were about 20 nm.

《Method for Forming First Gas Barrier Layer》

[Formation Method a]

A first gas barrier layer was formed on the smooth layer surface of a base of interest using the vacuum plasma CVD apparatus illustrated in FIG. 1. In this case, the high frequency power source which was used was a high frequency power source of 27.12 MHz with a distance between electrodes of 20 mm.

As source gases, a silane gas at a flow rate of 7.5 sccm, an ammonia gas at a flow rate of 50 sccm, and a hydrogen gas at a flow rate of 200 sccm were introduced into a vacuum chamber under the conditions thereof. The temperature of the base of interest was set at 100° C. at the start of forming a film, the gas pressure during the film formation was set at 4 Pa, and an inorganic film containing silicon nitride as a main component was formed with a film thickness of 30 nm, followed by changing the gas pressure to 30 Pa without changing the temperature of the base and by continuously forming an inorganic film containing silicon nitride as a main component with a film thickness of 30 nm to form the first gas barrier layer with a total film thickness of 60 nm. This method was regarded as a formation method a.

[Formation Method b]

A first gas barrier layer was formed in the same manner as the above-described formation method a of the first gas barrier layer except that, as source gases, a silane gas at a flow rate of 7.5 sccm, an ammonia gas at a flow rate of 50 sccm, and a hydrogen gas at a flow rate of 200 sccm were introduced into a vacuum chamber under the conditions thereof, then, the temperature of a film substrate was set at 100° C. at the start of forming a film, and the gas pressure during the film formation was set at 30 Pa to form an inorganic film containing silicon nitride as a main component with a film thickness of 40 nm. This method was regarded as a formation method b.

[Formation Method c]

A first gas barrier layer was formed in the same manner as the above-described formation method a of the first gas barrier layer except that, as source gases, a silane gas at a flow rate of 7.5 sccm, an ammonia gas at a flow rate of 50 sccm, and a hydrogen gas at a flow rate of 200 sccm were introduced into a vacuum chamber under the conditions thereof, then, the temperature of a film substrate was set at 100° C. at the start of forming a film, and the gas pressure during the film formation was set at 30 Pa to form an inorganic film containing silicon nitride as a main component with a film thickness of 100 nm. This method was regarded as a formation method c.

[Formation Method d]

A first gas barrier layer was formed in the same manner as the above-described formation method a of the first gas barrier layer except that, as source gases, a silane gas at a flow rate of 7.5 sccm, an ammonia gas at a flow rate of 100 sccm, and a nitrous oxide gas at a flow rate of 50 sccm were introduced into a vacuum chamber under the conditions thereof, then, the temperature of a film substrate was set at 100° C. at the start of forming a film, and the gas pressure during the film formation was set at 100 Pa to form an inorganic film containing silicon oxynitride as a main component with a film thickness of 50 nm. This method was regarded as a formation method d.

[Formation Method e]

A first gas barrier layer was formed in the same manner as the above-described formation method e of the first gas barrier layer except that, as source gases, a silane gas at a flow rate of 7.5 sccm, an ammonia gas at a flow rate of 100 sccm, and a nitrous oxide gas at a flow rate of 50 sccm were introduced into a vacuum chamber under the conditions thereof, then, the temperature of a film substrate was set at 100° C. at the start of forming a film, and the gas pressure during the film formation was set at 100 Pa to form an inorganic film containing silicon oxynitride as a main component with a film thickness of 200 nm. This method was regarded as a formation method e.

[Formation Method f]

A first gas barrier layer was formed in the same manner as the above-described formation method a of the first gas barrier layer except that, as source gases, an argon gas at a flow rate of 150 sccm, a silane gas at a flow rate of 7.5 sccm, and a nitrous oxide gas at a flow rate of 130 sccm were introduced into a vacuum chamber under the conditions thereof, then, the temperature of a film substrate was set at 100° C. at the start of forming a film, and the gas pressure during the film formation was set at 200 Pa to form an inorganic film containing silicon oxide as a main component with a film thickness of 50 nm. This method was regarded as a formation method f.

[Formation Method g]

An inorganic film containing silicon oxide as a main component was formed with a film thickness of 10 nm in the same manner as the above-described formation method f of the first gas barrier layer. Then, an inorganic film containing silicon nitride as a main component was formed thereon with a film thickness of 100 nm in the same manner as the formation method c of the first gas barrier layer to form a first gas barrier layer. This formation method was regarded as a formation method g.

[Formation Method h]

By a known vacuum deposition method, an inorganic film containing silicon oxide as a main component was formed with a film thickness of 40 nm on the surface of a smooth layer in a base of interest to form a first gas barrier layer. This formation method was regarded as a method h.

[Formation Method i]

By a known vacuum deposition method, an inorganic film containing aluminum oxide as a main component was formed with a film thickness of 40 nm on the surface of a smooth layer in a base of interest to form a first gas barrier layer. This formation method was regarded as a method i.

« Method for Forming Second Gas barrier Layer »

[Formation Method 1]

(Formation of Coating Film for Second Gas Barrier Layer)

A coating liquid 1 for forming a second gas barrier layer, containing a polysilazane compound described below, was coated on a base or first gas barrier layer of interest using a wireless bar so that the film thickness after drying was 300 nm. The drying conditions were 100° C. and 2 minutes.

<Preparation of Coating Liquid 1 for Forming Second Gas Barrier Layer>

The coating liquid 1 for forming a second gas barrier layer, containing an inorganic precursor compound, was used by mixing a dibutyl ether solution containing 20 weight % of perhydropolysilazane as a non-catalyst (AQUAMICA NN120-20, manufactured by AZ Electronic Materials) with a 20 weight % dibutyl ether solution of perhydropolysilazane containing an amine catalyst with a solid content of 5 weight % (AQUAMICA NAX120-20, manufactured by AZ Electronic Materials), and an amine catalyst was adjusted to 1 weight % as a solid content and further diluted with dibutyl ether, thereby preparing the coating liquid 1 for forming a second gas barrier layer as a dibutyl ether solution with a total solid content of 5 weight %.

(Conversion Treatment)

The coating film for a second gas barrier layer was formed as described above, followed by being subjected to conversion treatment by performing irradiation with vacuum ultraviolet rays according to a method described below to form the second gas barrier layer. The method for forming the second gas barrier layer is regarded as a formation method 1.

<Conditions of Irradiation with Vacuum Ultraviolet Rays>

Figure 3:
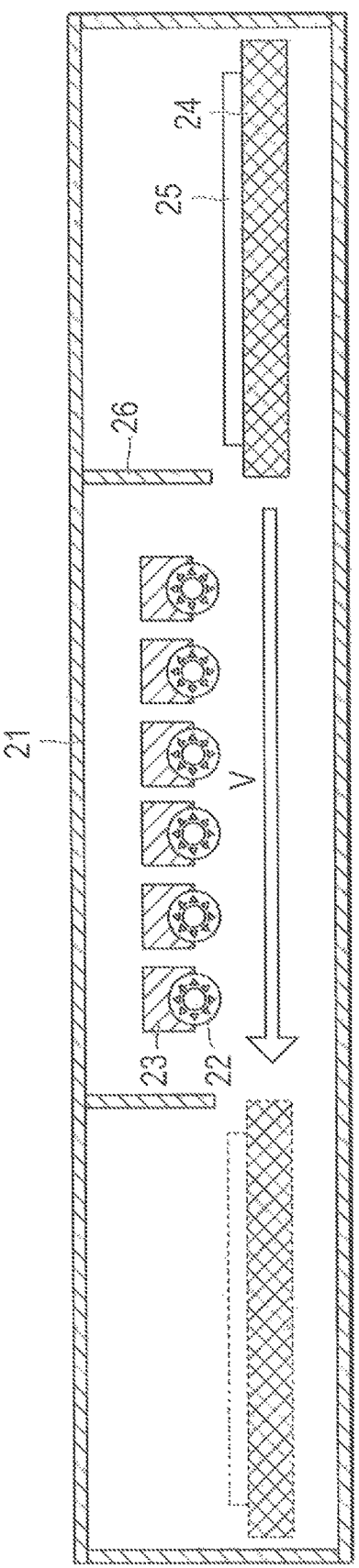
FIG. 3 is a cross-sectional schematic view illustrating an example of a vacuum ultraviolet ray irradiation apparatus used in the present invention.

The irradiation with vacuum ultraviolet rays was performed using the apparatus illustrated by the cross-sectional schematic view in FIG. 3.

In FIG. 3, reference numeral 21 denotes an apparatus chamber, in which moisture vapor can be substantially removed from the inside of the chamber to maintain the concentration of oxygen at a predetermined concentration by supplying the appropriate amounts of nitrogen and oxygen from a gas supply port (not illustrated) to the inside and exhausting them from a gas exhaust port (not illustrated). Reference numeral 22 denotes a Xe excimer lamp having a double tube structure which irradiates a vacuum ultraviolet ray of 172 nm; and reference numeral 23 denotes a holder for the excimer lamp, serving as an external electrode. Reference numeral 24 denotes a sample stage. The sample stage 24 can horizontally move back and forth at a predetermined rate by moving means (not illustrated) in the apparatus chamber 21. Further, the sample stage 24 can be maintained at a predetermined temperature by heating means (not illustrated). Reference numeral 25 denotes a sample on which a polysilazane compound coating layer is formed. The height of the sample stage is adjusted so that the shortest distance between the surface of the coating layer of the sample and the surface of the excimer lamp tube is 3 mm when the sample stage moves horizontally. Reference numeral 26 denotes a light blocking plate, which prevents the coating layer of the sample from being irradiated with vacuum-ultraviolet light during aging the Xe excimer lamp 22.

Energy with which the surface of the coating layer of the sample was irradiated in the vacuum ultraviolet ray irradiation step was measured using a UV integral actinometer: C8026/H8025 UV POWER METER, manufactured by Hamamatsu Photonics K.K., using a sensor head of 172 nm. For the measurement, the sensor head was placed in the center of the sample stage 24 so that the shortest distance between the surface of the Xe excimer lamp tube and the measuring surface of the sensor head was 3 mm, nitrogen and oxygen were supplied so that an atmosphere in the apparatus chamber 21 has the same oxygen concentration as that in the vacuum ultraviolet ray irradiation step, and the sample stage 24 was moved at a rate of 0.5 m/min to perform the measurement. After aging time of 10 minutes after lighting the Xe excimer lamp to stabilize the illuminance of the Xe excimer lamp 22 prior to the measurement, the sample stage was moved to start the measurement.

After ageing for 10 minutes, an irradiation distance of 3 mm and an oxygen concentration of 0.1% were set with the maximum illuminance of 90 mW/cm$^2$ and an integrated irradiation energy of 2000 mJ/cm$^2$. Further, conversion treatment was carried out at the temperature of the sample stage 24 of 80° C. and the moving velocity V of the sample stage 24 of 0.6 mm/min.

[Formation Method 2]

A second gas barrier layer was formed in the same manner as the above-described formation method 1 except that the vacuum ultraviolet ray irradiation conditions in the conversion treatment were changed as described below. This formation method was regarded as a formation method 2.

(Formation of Coating Film for Second Gas Barrier Layer)

Oxygen concentration: 0.5%

Temperature of sample stage 24: 80° C.

Moving velocity V of sample stage 24: 0.6 mm/min

Integrated irradiation energy: 1800 mJ/cm$^2$

[Formation Methods 3 to 8]

Similarly, second gas barrier layers were formed in the same manner as the above-described formation method 1 except that the film thicknesses of the formed coating films for the second gas barrier layers and vacuum ultraviolet ray irradiation conditions in conversion treatment were changed to the conditions described in Table 1, and these formation methods were regarded as formation methods 3 to 8.

« Production of Gas Barrier Films »

[Production of Gas Barrier Films 1 to 23]

The bases described above, the methods for forming the first gas barrier layers, and the methods for forming the second gas barrier layers were combined as described in Table 1 to produce gas barrier films 1 to 23.

(Production of Gas Barrier Film 1)

The first gas barrier layer was formed on the surface side of the smooth layer of the base (a) according to the above-described formation method c of the first gas barrier layer to produce the gas barrier film 1. The second gas barrier layer was not formed on the gas barrier film 1.

(Production of Gas Barrier Film 2)

A gas barrier film 2 was produced in the same manner as the above-described production of the gas barrier film 1 except that the formation method e instead of the formation method c was used as a method for forming a first gas barrier layer.

(Production of Gas Barrier Film 3)

The second gas barrier layer was formed on the surface side of the smooth layer of the base (a) according to the formation method 1 of the second gas barrier layer to produce the gas barrier film 3. The first gas barrier layer was not formed on the gas barrier film 3.

(Production of Gas Barrier Film 4)

The first gas barrier layer was formed on the surface side of the smooth layer of the base (a) according to the formation method a of the first gas barrier layer, followed by forming the second gas barrier layer on the formed first gas barrier layer according to the formation method 2 of the second gas barrier layer to produce the gas barrier film 4.

(Production of Gas Barrier Films 5 to 17)

The gas barrier films 5 to 17 were produced in the same manner as the above-described production of the gas barrier film 4 except that the kind of the base used, the method for forming the first gas barrier layer, and the method for forming the second gas barrier layer were changed to the combination described in Table 1.

(Production of Gas Barrier Film 18)

The first gas barrier layer 1 was formed on one surface side of the base (b) according to the formation method c of the first gas barrier layer. Then, the first gas barrier layer 2 was formed on the surface opposite to the surface of the base (b), on which the first gas barrier layer 1 was formed, according to the formation method c of the first gas barrier layer, to produce the gas barrier film 18 in which the first gas barrier layers were disposed on both surfaces of the base.

(Production of Gas Barrier Film 19)

The first gas barrier layer 1 was formed on one surface side of the base (b) according to the formation method c of the first gas barrier layer, followed by forming the second gas barrier layer 1 on the formed first gas barrier layer 1 according to the formation method 5 of the second gas barrier layer. Then, the first gas barrier layer 2 was formed on the surface opposite to the surface of the base (b), on which the first gas barrier layer 1 and the second gas barrier layer 1 were formed, according to the formation method c of the first gas barrier layer, and the second gas barrier layer 2 was then formed on the formed first gas barrier layer 2 according to the formation method 5 of the second gas barrier layer to produce the gas barrier film 19 in which the first gas barrier layer and the second gas barrier layers were disposed on both surfaces of the base.

(Production of Gas Barrier Film 20)

The first gas barrier layer was formed on one surface side of the base (c) according to the formation method c of the first gas barrier layer, followed by forming the second gas barrier layer on the formed first gas barrier layer according to the formation method 5 of the second gas barrier layer to produce the gas barrier film 20.

(Production of Gas Barrier Film 21)

The first gas barrier layer 1 was formed on one surface side of the base (c) according to the formation method c of the first gas barrier layer. Then, the first gas barrier layer 2 was formed on the surface opposite to the surface of the base (c), on which the first gas barrier layer 1 was formed, according to the formation method c of the first gas barrier layer, to produce the gas barrier film 21 in which the first gas barrier layers were disposed on both surfaces of the base.

(Production of Gas Barrier Film 22)

The first gas barrier layer 1 was formed on one surface side of the base (c) according to the formation method c of the first gas barrier layer, followed by forming the second gas barrier layer 1 on the formed first gas barrier layer 1 according to the formation method 8 of the second gas barrier layer. Then, the first gas barrier layer 2 was formed on the surface opposite to the surface of the base (c), on which the first gas barrier layer 1 and the second gas barrier layer 1 were formed, according to the formation method c of the first gas barrier layer, and the second gas barrier layer 2 was then formed on the formed first gas barrier layer 2 according to the formation method 8 of the second gas barrier layer to produce the gas barrier film 22 in which the first gas barrier layer and the second gas barrier layers were disposed on both surfaces of the base.

(Production of Gas Barrier Film 23))

The second gas barrier layer 1 was formed on one surface side of the base (c) according to the formation method 5 of the second gas barrier layer. Then, the second gas barrier layer 2 was formed on the surface opposite to the surface of the base (c), on which the second gas barrier layer 1 was formed, according to the formation method 5 of the second gas barrier layer, to produce the gas barrier film 23 in which the second gas barrier layers were disposed on both surfaces of the base.

The constitutions of the gas barrier films 1 to 23 produced as described above are listed in Table 1.

TABLE 1

| | | First Gas Barrier Layer | | | Second Gas Barrier Layer | | | | | | |
|---|---|---|---|---|---|---|---|---|---|---|---|
| | | | | | | Dried | | Vacuum UV Irradiation Step Conditions | | | |
| | | | | | | | | Sample Stage Conditions | | Integrated | |
| Gas Barrier Film No. | Kind of Base | Forming Surface | Formation Method No. | Forming Surface | Formation Method No. | Film Thickness (nm) | Oxygen Concentration (%) | Heating Temperature (° C.) | Moving Velocity (mm/min) | Irradiation Energy (mJ/cm$^2$) | Remarks |
| 1 | (a) | One Surface | c | — | — | — | — | — | — | — | Comparative Example |
| 2 | (a) | One Surface | e | — | — | — | — | — | — | — | Comparative Example |
| 3 | (a) | — | — | One Surface | 1 | 300 | 0.1 | 80 | 0.6 | 2000 | Comparative Example |
| 4 | (a) | One Surface | a | One Surface | 2 | 300 | 0.5 | 80 | 0.6 | 1800 | The Present Invention |
| 5 | (a) | One Surface | a | One Surface | 3 | 200 | 0.1 | 100 | 1.0 | 1200 | The Present Invention |

TABLE 1-continued

| | | | | Second Gas Barrier Layer | | | | | | |
|---|---|---|---|---|---|---|---|---|---|---|
| | | First Gas Barrier Layer | | | | | Vacuum UV Irradiation Step Conditions | | | |
| | | | | | Dried | | Sample Stage Conditions | | Integrated | |
| Gas Barrier Film No. | Kind of Base | Forming Surface | Formation Method No. | Forming Surface | Formation Method No. | Film Thickness (nm) | Oxygen Concentration (%) | Heating Temperature (° C.) | Moving Velocity (mm/min) | Irradiation Energy (mJ/cm²) | Remarks |
| 6 | (a) | One Surface | a | One Surface | 4 | 100 | 0.1 | 100 | 0.8 | 1500 | The Present Invention |
| 7 | (a) | One Surface | b | One Surface | 5 | 200 | 0.1 | 100 | 0.8 | 1500 | The Present Invention |
| 8 | (a) | One Surface | c | One Surface | 5 | 200 | 0.1 | 100 | 0.8 | 1500 | The Present Invention |
| 9 | (a) | One Surface | d | One Surface | 5 | 200 | 0.1 | 100 | 0.8 | 1500 | The Present Invention |
| 10 | (a) | One Surface | e | One Surface | 5 | 200 | 0.1 | 100 | 0.8 | 1500 | The Present Invention |
| 11 | (a) | One Surface | f | One Surface | 5 | 200 | 0.1 | 100 | 0.8 | 1500 | Comparative Example |
| 12 | (a) | One Surface | g | One Surface | 5 | 200 | 0.1 | 100 | 0.8 | 1500 | The Present Invention |
| 13 | (a) | One Surface | h | One Surface | 5 | 200 | 0.1 | 100 | 0.8 | 1500 | Comparative Example |
| 14 | (a) | One Surface | i | One Surface | 5 | 200 | 0.1 | 100 | 0.8 | 1500 | Comparative Example |
| 15 | (a) | One Surface | d | One Surface | 6 | 200 | 0.001 | 100 | 0.8 | 1550 | The Present Invention |
| 16 | (b) | One Surface | c | One Surface | 5 | 200 | 0.1 | 100 | 0.8 | 1500 | The Present Invention |
| 17 | (b) | One Surface | c | One | 7 | 300 | 0.1 | 150 | 0.8 | 1500 | The Present Invention |
| 18 | (b) | Both Surfaces | c | — | — | — | — | — | — | — | Comparative Example |
| 19 | (b) | Both Surfaces | c | Both Surfaces | 5 | 200 | 0.1 | 100 | 0.8 | 1500 | The Present Invention |
| 20 | (c) | One Surface | c | One Surface | 5 | 200 | 0.1 | 150 | 0.8 | 1500 | The Present Invention |
| 21 | (c) | Both Surfaces | c | — | — | — | — | — | — | — | Comparative Example |
| 22 | (c) | Both Surfaces | c | Both Surfaces | 8 | 300 | 0.1 | 100 | 0.8 | 1500 | The Present Invention |
| 23 | (c) | — | — | Both Surfaces | 5 | 200 | 0.1 | 100 | 0.8 | 1500 | Comparative Example |

[Production of Comparative Sample (I)]

The first gas barrier layer was formed on the surface of the smooth layer of the base (a) by the formation method a of the first gas barrier layer, followed by forming an inorganic film containing oxidizable silicon nitride as a main component with a film thickness of 200 nm according to the method described in Examples of JP-A No. 2009-029070 to produce a comparative sample (I). In addition, the comparative sample (I) was stored in a desiccator until an evaluation described below.

[Production of Comparative Sample (II)]

The first gas barrier layer was formed on the surface of the smooth layer of the base (a) by the formation method a of the first gas barrier layer, followed by coating the coating liquid 1 containing the polysilazane compound so that the dried film thickness if 200 nm to form a polysilazane layer. The drying conditions were set at 100° C. and 2 minutes. The polysilazane layer was considered to include many remaining uncured portions and this sample was regarded as a comparative sample (II). This comparative sample (II) was stored in a desiccator until an evaluation described below.

« Measurement of Composition $SiO_xN_y$ of Gas Barrier Film »

The composition distributions of the first gas barrier layers and the second gas barrier layers of the produced gas barrier films 1 to 23 described above in the thickness direction were determined by being measured by the method using the XPS analysis.

Since the etch rates of the first gas barrier layer and the second gas barrier layer differed according to the compositions, the thickness in the XPS analysis in accordance within the present invention was temporarily determined based on the etch rate in terms of $SiO_2$, and the thicknesses of the first gas barrier layer and the second gas barrier layer were determined, respectively, by the cross section TEM images of an identical sample. Regions corresponding to the first gas barrier layer and the second gas barrier layer in the composition distributions in the thickness direction were specified while comparing the thicknesses with the composition distributions determined by the XPS analysis in the thickness direction, and the thickness of the region corresponding to the first gas barrier layer and the thickness of the region corresponding to the second gas barrier layer were corrected in the thickness direction by being uniformly multiplied by a coefficient to individually each match the film thicknesses determined by the cross section TEM images.

(XPS Analysis Conditions)
Apparatus: QUANTERA SXM manufactured by ULVAC-PHI, Inc.
X-ray source: Monochromatized Al—Kα
Measurement regions: Si2p, C1s, N1s, O1s
Sputtered ions: Ar (2 keV)
Depth profile: Measurement is repeated after sputtering for 1 minute.
Quantitation: A background was determined by the Shirley method to conduct quantitation using a relative sensibility coefficient method from an obtained peak area. Multi Pak manufactured by ULVAC-PHI, Inc. was used for data processing.

By the above described XPS analysis method, (1) the thickness of a region satisfying $0.25 \leq x \leq 1.1$ and $0.4 \leq y \leq 0.75$, which were in the condition (A) in the second gas barrier layer, in the depth direction, was determined.

(2) The thickness of a region satisfying $0.25 \leq x \leq 0.55$ and, $0.55 \leq y \leq 0.75$, which were in the condition (B) in the second gas barrier layer, in the depth direction, was determined.

(3) The x/y value in the surface layer of the second gas barrier layer was determined.

(4) The maximum value of the y value in the first gas barrier layer and the maximum value of the y value in the second gas barrier layer were determined. In addition, for the sample on both surfaces of which the gas barrier layers were disposed, the gas barrier layer was formed on one surface side of the base, followed by performing the measurement for the first gas barrier layer 2 or the second gas barrier layer 2 formed on the opposite side of the base.

« Evaluation of Variation in Composition Distribution under High Temperature and High Humidity »

Variations in composition distribution under high temperature and high humidity were evaluated using the produced gas barrier films 4-10, 12, 15-17, 19, 20 and 22 of the present invention, the comparative sample (I), and the comparative sample (II).

The XPS analysis of each sample was carried out in the storage environment at 60° C. and 90% RH for a storage period of every one day. The amount of N in the second gas barrier layer, the amount of N in the oxidizable CVD silicon nitride layer, and the amount of N in the polysilazane layer in which the uncured portions remained were confirmed in each gas barrier film according to the present invention, the comparative sample (I), and the comparative sample (II), respectively, to determine days for which N in each layer substantially disappeared and was completely oxidized.

As a result, the comparative sample (II) was completely oxidized for a storage period of 1 day. The comparison sample (I) was completely oxidized for a storage period of 3 days. In contrast, almost no variation in composition was seen in each gas barrier film of the present invention even for a storage period of 14 days.

As described above, it is found that the gas barrier film of the present invention has very good storage stability for a gas barrier film alone since the surface layer of the second gas barrier layer has a high gas barrier property.

« Evaluation of Moisture Vapor Barrier Property »

(Apparatus for Producing Sample for Evaluation of Moisture Vapor Barrier Property)

Vapor deposition apparatus: Vacuum deposition apparatus JEE-400, manufactured by JEOL Ltd.

Constant temperature-constant humidity oven: Yamato Humidic Chamber IG47M (Raw Material)

Metal corroded by reaction with water: Calcium (granular)

Moisture vapor impermeable metal: Aluminum (φ3-5 mm, granular)

(Production of Sample for Evaluation of Moisture Vapor Barrier Property)

Metal calcium was deposited with a size of 12 mm×12 mm through a mask on the surfaces of the gas barrier layers of the produced gas barrier films 1 to 23 using a vacuum deposition apparatus (vacuum deposition apparatus JEE-400, manufactured by JEOL Ltd.). For the sample on both surfaces of which the gas barrier layers were formed, the gas barrier layer surface of the side on which the first gas barrier layer or the second gas barrier layer was finally formed was used.

Then, the mask was removed while the vacuum state was maintained, and aluminum was deposited on the whole surface of one side of the sheet and temporarily sealed. Then, the vacuum state was released and promptly shifted to dried nitrogen atmosphere, quartz glass with a thickness of 0.2 mm was affixed to the aluminum-deposited surface through a UV curable resin for sealing (manufactured by Nagase ChemteX Corporation), and the resin was cured and adhered to be really sealed by irradiated with ultraviolet light to produce a sample for evaluation of a moisture vapor barrier property.

The obtained samples were stored for each of 20 hours, for 40 hours, and 60 hours under high temperature and high humidity of 85° C. and 90% RH and an area with corroded metal calcium based on a metal calcium-deposited area of 12 mm/12 mm was calculated by % expression to evaluate their moisture vapor barrier properties according to the following criteria.

Good: An area with corroded metal calcium is less than 1.0%.

Fair: An area with corroded metal calcium is 1.0% or more and less than 5.0%.

Poor: An area with corroded metal calcium is 5.0% or more.

The evaluation results obtained as described above as well as the XPS analysis results are listed in Table 2.

TABLE 2

| Gas Barrier Film No. | Composition Characteristics of Second Gas Barrier Layer | | | | First Gas Barrier Layer (4) Maximum Value of y Value | Evaluation Results Moisture Vapor Barrier Property | | | Remarks |
|---|---|---|---|---|---|---|---|---|---|
| | (1) Region (nm) Specified in Expressions (A) | (2) Region (nm) Specified in Expressions (B) | (3) x/y value of Surface Layer | (4) Maximum Value of y Value | | 20 h | 40 h | 60 h | |
| 1 | — | — | — | — | 0.91 | Fair | Poor | Poor | Comparative Example |
| 2 | — | — | — | — | 0.80 | Fair | Poor | Poor | Comparative Example |
| 3 | 23 | 0 | 18.0 | 0.62 | — | Fair | Poor | Poor | Comparative Example |
| 4 | 284 | 276 | 16.0 | 0.68 | 0.88 | Good | Good | Good | The Present Invention |
| 5 | 184 | 169 | 10.0 | 0.70 | 0.88 | Good | Good | Good | The Present Invention |
| 6 | 77 | 61 | 15.0 | 0.70 | 0.88 | Good | Good | Fair | The Present Invention |
| 7 | 161 | 0 | 20.0 | 0.52 | 0.78 | Good | Fair | Fair | The Present Invention |
| 8 | 184 | 169 | 16.0 | 0.70 | 0.90 | Good | Good | Good | The Present Invention |
| 9 | 169 | 154 | 17.0 | 0.65 | 0.70 | Good | Good | Good | The Present Invention |
| 10 | 184 | 169 | 16.0 | 0.68 | 0.70 | Good | Good | Good | The Present Invention |
| 11 | 40 | 0 | 20.0 | 0.30 | 0.00 | Fair | Poor | Poor | Comparative Example |
| 12 | 184 | 169 | 16.0 | 0.70 | 0.91 | Good | Good | Good | The Present Invention |
| 13 | 31 | 0 | 18.0 | 0.62 | 0.00 | Fair | Poor | Poor | Comparative Example |
| 14 | 23 | 0 | 18.0 | 0.62 | 0.00 | Fair | Poor | Poor | Comparative Example |
| 15 | 169 | 154 | 5.0 | 0.65 | 0.70 | Good | Good | Fair | The Present Invention |
| 16 | 184 | 169 | 16.0 | 0.70 | 0.91 | Good | Good | Good | The Present Invention |
| 17 | 284 | 276 | 15.0 | 0.70 | 0.91 | Good | Good | Good | The Present Invention |
| 18 | — | — | — | — | 0.91 | Fair | Poor | Poor | Comparative Example |
| 19 | 184 | 169 | 16.0 | 0.70 | 0.91 | Good | Good | Good | The Present Invention |
| 20 | 184 | 169 | 16.0 | 0.70 | 0.91 | Good | Good | Good | The Present Invention |
| 21 | — | — | — | — | 0.91 | Fair | Fair | Poor | Comparative Example |
| 22 | 284 | 276 | 15.0 | 0.70 | 0.91 | Good | Good | Good | The Present Invention |
| 23 | 23 | 0 | 18.0 | 0.60 | — | Fair | Fair | Poor | Comparative Example |

As listed in Table 1, it is found that the gas barrier films of the present invention have very high barrier performance.

« Evaluation of Heat Resistance of Gas Barrier Film»

The gas barrier films 16, 17, 19, 20, and 22 produced as described above were subjected to heat treatment at 220° C. for 10 minutes under air atmosphere. In this case, the surfaces of the gas barrier layers of the gas barrier films (sites to be used as samples for evaluation of moisture vapor barrier properties as described below) were held so that a member did not contact with them. After the heat treatment, they were taken out in atmospheric air at room temperature and cooled to the room temperature without being processed. Then, evaluations of moisture vapor barrier properties were carried out in the same manner as in the evaluation of the moisture vapor barrier property in evaluation 1, and the obtained results are listed in Table 3.

TABLE 3

| Gas Barrier Film No. | Evaluation of Heat Resistance Moisture vapor Barrier Property | | | Remarks |
|---|---|---|---|---|
| | 20 h | 40 h | 60 h | |
| 16 | Good | Good | Good | The Present Invention |
| 17 | Good | Good | Good | The Present Invention |
| 19 | Good | Good | Good | The Present Invention |
| 20 | Good | Good | Good | The Present Invention |
| 22 | Good | Good | Good | The Present Invention |

As listed in Table 3, it is found that the gas barrier films of the present invention are excellent in heat resistance and have very high barrier properties.

Example 2

« production of Organic Thin Film Electronic Device »

Organic EL elements 1 to 16 which were organic thin film electronic devices were produced using the gas barrier films 1, 3, 4, 7-11, and 16-23 produced in Example 1 as sealing films.

[Production of Organic EL Element]

(Formation of First Electrode Layer)

ITO (indium tin oxide) with a thickness of 150 nm was formed on the gas barrier layer of each gas barrier film by a sputtering method and patterned by a photolithography method to form a first electrode layer. In addition, the pattern was made to have a 50 mm square light-emitting area.

(Formation of Hole Transport Layer)

A coating liquid for forming a hole transport layer described below was coated on the first electrode layer of each gas barrier film, on which the first electrode layer was formed, by an extrusion coating machine and thereafter dried to form a hole transport layer. The coating liquid for forming a hole transport layer was coated so that the thickness after drying was 50 nm.

Prior to coating the coating liquid for forming a hole transport layer, the cleaning surface conversion treatment of the barrier property film was carried out using a low-pressure mercury lamp with a wavelength of 184.9 nm at an irradiation intensity of 15 mW/cm$^2$ and a distance of 10 mm. A static eliminator with feeble X-rays was used for charge elimination treatment.

<Coating Conditions>

A coating step was carried out in an environment at 25° C. and a relative humidity (RH) of 50% in atmospheric air.

<Preparation of Coating Liquid for Forming Hole Transport Layer>

A solution in which polyethylenedioxythiophene/polystyrene sulfonate (PEDOT/PSS, Bytron PAI 4083 manufactured by Bayer) was diluted with 65% pure water and 5% methanol was prepared as a coating liquid for forming a hole transport layer.

<Drying and Heat Treatment Conditions>

After coating the coating liquid for forming a hole transport layer, a solvent was removed with a height of 100 mm, a discharge wind speed of 1 m/s, a widthwise wind speed distribution of 5%, and a temperature 100° C. toward a deposited surface, followed by subsequently carrying out heat treatment in a back surface heat transfer system at a temperature 150° C. using a heat treatment apparatus to form a hole transport layer.

(Formation of Light-Emitting Layer)

Subsequently, a coating liquid for forming a white light-emitting layer described below was coated on the hole transport layer of each gas barrier film on which even the hole transport layer was formed, by an extrusion coating machine, and thereafter dried to form a light-emitting layer. The coating liquid for forming a white light-emitting layer was coated so that the thickness after drying was 40 nm.

<Coating Liquid for Forming White light-Emitting Layer>

In 100 g of toluene, 1.0 g of a host material H-A, 100 mg of a dopant material D-A, 0.2 mg of a dopant material D-B, and 0.2 mg of a dopant material D-C were dissolved to prepare the resultant as a coating liquid for forming a white light-emitting layer.

[Formula 1]

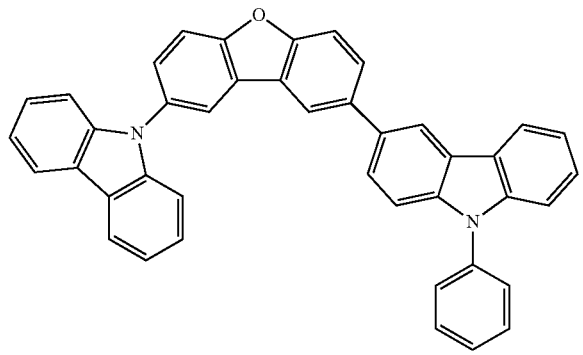

H-A

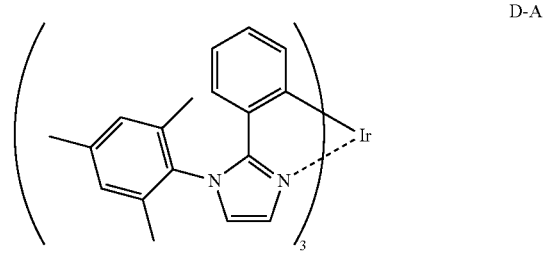

D-A

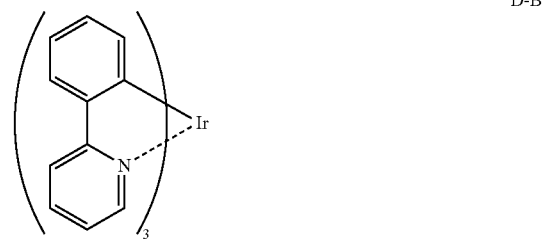

D-B

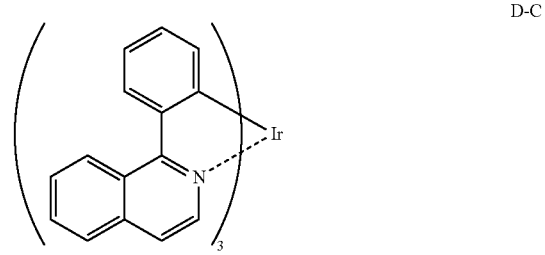

D-C

<Coating Conditions>

A coating step was carried out at a temperature of 25° C. and a coating speed of 1 m/min in an atmosphere with a nitrogen gas concentration of 99% or more.

<Drying and Heat Treatment Conditions>

After coating the coating liquid for forming a white light-emitting layer, a solvent was removed with a height of 100 mm, a discharge wind speed of 1 m/s, a widthwise wind speed distribution of 5%, and a temperature 60° C. toward a deposited surface. Then, heat treatment at a temperature 130° C. was carried out to form a light-emitting layer.

(Formation of Electron Transport Layer)

Then, a coating liquid for forming an electron transport layer described below was coated by an extrusion coating machine, and thereafter dried to form an electron transport layer. The coating liquid for forming an electron transport layer was coated so that the thickness after drying was 30 nm.

<Coating Conditions>

A coating step was carried out at the coating temperature of the coating liquid for forming an electron transport layer of 25° C. and a coating speed of 1 m/min in an atmosphere with a nitrogen gas concentration of 99% or more.

<Coating Liquid for Forming Electron Transport Layer>

As for the electron transport layer, E-A was dissolved in 2,2,3,3-tetrafluoro-1-propanol to make a 0.5 weight % solution as the coating liquid for forming an electron transport layer.

[Formula 2]

E-A

<Drying and Heat Treatment Conditions>

After coating the coating liquid for forming an electron transport layer, a solvent was removed with a height of 100 mm, a discharge wind speed of 1 m/s, a widthwise wind speed distribution of 5%, and a temperature 60° C. toward a deposited surface. Then, heat treatment at a temperature 200° C. was carried out in a heat treatment portion to form an electron transport layer.

(Formation of Electron Injection Layer)

Then, an electron injection layer was formed on the formed electron transport layer. First, a substrate was put into a pressure reduction chamber and a pressure was reduced to $5 \times 10^{-4}$ Pa. Cesium fluoride previously prepared on a vapor deposition boat made of a tantalum in a vacuum chamber was heated to form the electron injection layer with a thickness of 3 nm.

(Formation of Second Electrode)

Except for a portion to be an extraction electrode on the first electrode, a mask pattern is formed on the formed electron injection layer to have a 50 mm square light-emitting area by a vapor deposition method to have an extraction electrode using aluminum as a second electrode formation material under a vacuum of $5 \times 10^{-4}$ Pa, and a second electrode with a thickness of 100 nm was laminated.

(Cutting)

Each gas barrier film on which even the second electrode was formed was moved to a nitrogen atmosphere again and was cut in a specified size using a UV laser to produce an organic EL element.

(Electrode Lead Connection)

A flexible printed circuit board (base film: polyimide of 12.5 µm, rolled copper foil of 18 µm, cover lay: polyimide of 12.5 µm, surface treatment NiAu plating) was connected to the produced organic EL element using an anisotropic conductive film DP3232S9, manufactured by Sony Chemical & Information Device Corporation.

Crimping was conducted under crimping conditions: a temperature 170° C. (ACF temperature of 140° C. measured separately using a thermocouple), a pressure of 2 MPa, and 10 seconds.

(Sealing)

A sealing member was adhered to the organic EL element, to which the electrode lead (flexible printed circuit board) was connected, using a commercially available roll laminator, and organic EL elements 1 to 16 were produced.

In addition, as the sealing member, there was used a member in which a polyethylene terephthalate (PET) film (with a thickness of 12 µm) was laminated on aluminum foil with a thickness of 30 µm (manufactured by Toyo Aluminum K.K.) using an adhesive for dry lamination (two liquid reaction type urethane-based adhesive) (the thickness of the adhesive layer of 1.5 µm).

An aluminum surface was coated uniformly with a thermosetting adhesive with a thickness of 20 µm along the adhesive surface (gloss surface) of the aluminum foil using a dispenser.

The following epoxy adhesives were used for the thermosetting adhesive.

Bisphenol-A diglycidyl ether (DGEBA)
Dicyandiamide (DICY)
Epoxy adduct curing accelerator Thereafter, a sealing substrate was brought into intimate contact and placed to cover a junction between the extraction electrode and the electrode lead and was brought into intimate contact and sealed using a crimping roller under crimping conditions: a crimping roller temperature of 120° C., a pressure of 0.5 MPa, and an apparatus rate of 0.3 m/min.

《 Evaluation of Organic EL Element 》

The durabilities of the organic EL elements 1 to 16 produced as described above were evaluated according to the following method.

[Evaluation of Durability]

(Accelerated Aging Treatment)

Each organic EL element produced as described above was subjected to accelerated aging treatment for 400 hours under an environment of 60° C. and 90% RH, followed by carrying out an evaluation for black specks as described below, together with organic EL elements that had not been subjected to accelerated aging treatment.

(Evaluation of Black Specks)

An electric current of 1 mA/cm$^2$ was applied to each of the organic EL elements subjected to the accelerated aging treatment and the organic EL elements that had not been subjected to the accelerated aging treatment and light was continuously emitted for 24 hours, followed by magnifying a part of a panel by a 100-time microscope (MS-804 manufactured by Moritex Corporation, lens MP-ZE25-200) to be photographed. A captured image was cut into a 2 mm square part, the ratio of the area of generated black specks was determined, an element deterioration resistance rate was calculated according to the following expression, and durability was evaluated according to the following criteria. Evaluation ranks of "Excellent" and "Good" were judged to be preferred characteristics for practical use.

Element deterioration resistance rate=(area of black specks generated in element without subjected to accelerated aging treatment)/(area of black specks generated in element subjected to accelerated aging treatment)×100(%)

Excellent: Element deterioration resistance rate of 90% or more

Good: Element deterioration resistance rate of 60% or more and less than 90%

Fair: Element deterioration resistance rate of 20% or more and less than 60%

Poor: Element deterioration resistance rate of less than 20%

The results obtained as described above are listed in Table 4.

TABLE 4

| Organic EL Element No. | Gas Barrier Film No. | Durability | Remarks |
|---|---|---|---|
| 1 | 1 | Poor | Comparative Example |
| 2 | 3 | Poor | Comparative Example |
| 3 | 4 | Excellent | The Present Invention |
| 4 | 7 | Good | The Present Invention |
| 5 | 8 | Excellent | The Present Invention |
| 6 | 9 | Excellent | The Present Invention |
| 7 | 10 | Excellent | The Present Invention |
| 8 | 11 | Poor | Comparative Example |
| 9 | 16 | Excellent | The Present Invention |
| 10 | 17 | Excellent | The Present Invention |
| 11 | 18 | Poor | Comparative Example |
| 12 | 19 | Excellent | The Present Invention |
| 13 | 20 | Excellent | The Present Invention |
| 14 | 21 | Poor | Comparative Example |
| 15 | 22 | Excellent | The Present Invention |
| 16 | 23 | Fair | Comparative Example |

As is clear from the results of Table 4, it is found that the gas barrier films of the present invention have very high gas barrier properties which can be used for sealing films for organic EL elements.

REFERENCE SIGNS LIST

1 Vacuum chamber
2, 3 Film formation roll
4 Unwind roll
5 Facing space
6 Transport roll
7 Wind-up roll
8 Film formation gas supply pipe
9 Vacuum exhaust port
10 Vacuum pump
12, 13 Magnetic field generation member
14 Plasma power source
21 Apparatus chamber
22 Xe excimer lamp
23 Holder for excimer lamp
24 Sample stage
25 Sample
26 Light blocking plate
101 Plasma CVD apparatus
102 Vacuum tank
103 Cathode electrode
105 Susceptor
106 Heat medium circulating system
107 Vacuum exhaust system
108 Gas introduction system
109 High frequency power source
110 Substrate
S Base

What is claimed is:

1. A gas barrier film comprising:
a base;
a first gas barrier layer which is formed on the base by a physical vapor deposition method or a chemical vapor deposition method, wherein the first gas barrier layer is an inorganic film comprising silicon nitride or silicon oxynitride as a main component and has a film thickness of 40 nm or more and 200 nm or less; and
a second gas barrier layer which is directly adjacent to the first gas barrier layer and is formed by coating a solution containing a polysilazane compound on the first gas barrier layer, wherein the second gas barrier layer has a film thickness of 50 nm or more and 300 nm or less,
wherein the second gas barrier layer is subjected to a conversion treatment by being irradiated with a vacuum ultraviolet ray; and
when the compositions of the second gas barrier layer is represented by $SiO_xN_y$, the distribution of the composition $SiO_xN_y$ of the second gas barrier layer in a thickness direction satisfies a condition specified in the following (A):
(A) the second gas barrier layer includes 50 nm or more of a region of $0.25 \leq x \leq 1.1$ and $0.4 \leq y \leq 0.75$ in the thickness direction.

2. The gas barrier film according to claim 1, wherein the distribution of the composition $SiO_xN_y$ of the second gas barrier layer in a thickness direction satisfies a condition specified in the following (B):
(B) the second gas barrier layer includes 50 nm or more of a region of $0.25 \leq x \leq 0.55$ and $0.55 \leq y \leq 0.75$ in the thickness direction.

3. The gas barrier film according to claim 1, wherein the composition of the first gas barrier layer is represented by $SiO_xN_y$, and the distribution of the compositions $SiO_xN_y$ of the first gas barrier layer and the second gas barrier layer in a thickness direction satisfies a condition specified in the following (C):
(C) the maximum value of a y value in the distribution of the compositions $SiO_xN_y$ of the first gas barrier layer and the second gas barrier layer is included in the first gas barrier layer.

4. The gas barrier film according to claim 1, wherein the distribution of the composition $SiO_xN_y$ of the second gas barrier layer in a thickness direction satisfies a condition specified in the following (D):

(D) in the surface layer region of the second gas barrier layer, x/y is 6.0 or more.

5. The gas barrier film according to claim 4, wherein the distribution of the composition $SiO_xN_y$ of the second gas barrier layer in a thickness direction satisfies the condition specified in the following (A'):

(A') the second gas barrier layer comprises a region of $0.25 \leq x \leq 1.1$ and $0.45 \leq y \leq 0.75$, the region having a thickness of 100 nm or more and 300 nm or less in the thickness direction.

6. An electronic device comprising the gas barrier film according to claim 1.

* * * * *